United States Patent
Abe et al.

(10) Patent No.: US 6,271,730 B1
(45) Date of Patent: Aug. 7, 2001

(54) VOLTAGE-CONTROLLED OSCILLATOR INCLUDING CURRENT CONTROL ELEMENT

(75) Inventors: Hiroyuki Abe; Yasuyuki Shindoh, both of Miyagi; Hirofumi Watanabe, Hyogo, all of (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/139,013

(22) Filed: Aug. 24, 1998

(30) Foreign Application Priority Data

Aug. 27, 1997 (JP) .................................................. 9-230760

(51) Int. Cl.$^7$ ...................................................... H03B 1/00
(52) U.S. Cl. ............................. 331/34; 331/57; 331/175; 327/264; 327/278; 455/260
(58) Field of Search .................. 331/57, 34, 1 A, 331/175; 327/264, 277, 278, 281; 455/260

(56) References Cited

U.S. PATENT DOCUMENTS

| | | | |
|---|---|---|---|
| 5,434,525 | * | 7/1995 | Leonowich ............................ 327/278 |
| 5,485,126 | * | 1/1996 | Gersbach et al. ..................... 331/57 |
| 5,499,214 | * | 3/1996 | Mori et al. . | |
| 5,594,392 | * | 1/1997 | Kondoh et al. ....................... 331/57 |

FOREIGN PATENT DOCUMENTS

| | | |
|---|---|---|
| 6120424 | 4/1994 | (JP) . |
| 6204297 | 7/1994 | (JP) . |
| 7007420 | 1/1995 | (JP) . |
| 8018408 | 1/1996 | (JP) . |
| 8162911 | 6/1996 | (JP) . |

OTHER PUBLICATIONS

"A 320 Mhz CMOS Triple 8 bit DAC with On–chip PLL and Hardware Cursor" IEE Journal Of Solid State Circuits, vol. 29, No. 12, Dec. 1994, pp. 1545–1550.

* cited by examiner

Primary Examiner—Arnold Kinkead
(74) Attorney, Agent, or Firm—Cooper & Dunham LLP

(57) ABSTRACT

An odd number of inverter circuits are connected with each other so as to form a ring. A first current-control element is provided between an oscillation signal line which is used for connecting adjacent inverter circuits and a power-source-potential point, a current flowing through the first current-control element varying by a first control signal. A second current-control element is provided between the oscillation signal line and a ground point, a current flowing through the second current-control element varying by a second control signal.

21 Claims, 15 Drawing Sheets

OSCILLATION FREQUENCY

RANGE OF OSCILLATION VOLTAGE

VOLTAGE-CONTROLLED OSCILLATOR INCLUDING CURRENT CONTROL ELEMENT

BACKGROUND OF THE INVENTION

1. Field of the Invention

The present invention relates to a voltage-controlled oscillator which can change a frequency of a signal to be generated, based on a control voltage, a semiconductor integrated circuit and a phase-locked loop (PLL) circuit using the voltage-controlled oscillator, and an intermediate-frequency processing circuit using the phase-locked loop circuit.

2. Description of the Related Art

Recently, mobile communication devices in accordance with standards such as PDS (Personal Digital Cellular), PHS (Personal Handy Phone) and so forth have rapidly become popular. This is because semiconductor chips incorporated into such devices have been miniaturized and, thereby, the devices have been miniaturized and the weights thereof have been reduced. Further, miniaturization of semiconductor chips incorporated into mobile communication devices is demanded, and, also, it is demanded that such semiconductor chips consume less energy. Forming circuits by CMOS (Complementary Metal Oxide Semiconductor) and, thus, integrating the circuits into one chip as much as possible is effective to obtain a miniaturized less-energy-consuming semiconductor chip. Thereby, it is possible to reduce the cost of semiconductor components.

Noise transmission between circuits is a problem in forming circuits of a communication device in one chip. An intermediate-frequency (IF) processing circuit portion of a communication device includes a phase-locked loop (PLL) circuit which generates a local frequency on the order of 200 through 300 MHz, a voltage-controlled oscillator (VCO), a mixer which adjusts a carrier frequency of transmission and reception signals, an IF amplifier which amplifies a signal from the mixer, a modulator which modulates transmission and reception signals, and a filter. In the intermediate-frequency processing circuit portion, the VCO, mixer, IF amplifier, and modulator are analog circuits while the PLL circuit is a digital circuit. Therefore, an analog and digital mixed chip is formed. In the analog and digital mixed chip, it is necessary to physically and electrically separate a circuit block of a analog portion and a circuit block of a digital portion.

In Japanese Laid-Open Patent Application No. 6-120424, an art is disclosed in which leads and pads for supplying power to a digital output circuit are provided separately from leads and pads for supplying power to the other circuits, and, thereby, noise generated at a time of switching in the digital output circuit is prevented from adversely affecting analog circuits.

A VCO used in a PLL circuit for a communication device is demanded to have low jitter and high C/N (Carrier/Noise) characteristics. It is necessary to dispose the VCO separately from the other analog circuits in order to prevent the VCO from being affected by noise. A VCO in the prior art uses an LC oscillator or an RC oscillator in many cases. In such cases, at least L and C portions are externally connected. Thereby, noise transmission between the VCO and other circuits has not been a problem. However, when a whole VCO is formed by CMOS in one chip, it is necessary to form the VCO so as not to receive noise or to dispose the VCO so as not to receive noise.

In Japanese Laid-Open Patent Application No. 6-204297, an art is disclosed in which a terminal of the ground of an oscillating circuit and a terminal of the ground of another high-frequency circuit are separated and bonded in a package, thereby, isolation is performed, and, thus, the oscillating circuit and the other high-frequency circuit are formed in one chip.

The above-described two prior arts are methods for preventing noise generated by a circuit from being transmitted to another circuit. However, these methods are different from a fundamental method for preventing generation of noise itself.

In Japanese Laid-Open Patent Application No. 7-7420, an art is disclosed in which a current-constant logic is used in a phase comparing circuit of a PLL circuit, thereby, noise being prevented from being transmitted to another circuit via a power source, as a result of a passing-through current of a logic circuit being caused to be constant. This art is an example of preventing generation of noise by a circuit itself. However, this art does not include prevention of noise generation by a VCO which can be a large noise source.

A VCO in a PLL circuit has characteristics thereof degraded by a power-source voltage variation and/or noise from another circuit. Further, the VCO in the PLL circuit is a circuit which has the highest oscillation frequency and the largest oscillation amplitude in a chip, and, thereby, is a noise generation source. In particular, in the case of a VCO formed of CMOS, a passing-through current varies at a frequency same as the oscillation frequency. This variation in the passing-through current causes a variation in the power-source voltage, and, thus, power-source noise occurs. Further, due to parasitic capacitance coupling or radiation between adjacent signal lines, an oscillation signal on one signal line is transmitted to another signal line as noise. Such noise transmission may not be sufficiently eliminated as a result of providing a separate power source for the VCO and/or physically and electrically separating a VCO block. Therefore, it is important to reduce noise generated by the VCO.

In Japanese Laid-Open Patent Application No. 8-162911, an art is disclosed in which charging and discharging of a capacitor which is included in an oscillation circuit is performed by a constant current, and, thereby, the value of the constant current of the VCO which is oscillating is changed so that the oscillation frequency is controlled. In this art, the oscillation amplitude can be set to an arbitrary value. However, an operational amplifier is used as a comparator. Thereby, a circuit scale is large, and, also, a capacitor having a relatively large capacitance is needed. Therefore, the arrangement of this art is not suitable to be formed by CMOS in one chip.

In Japanese Laid-Open Patent Application No. 8-18408, a VCO is disclosed in which an odd number of inverter circuits of CMOS circuits are connected to form a ring (ring oscillator). In such a VCO, a comparator is not needed. Further, in Japanese Laid-Open Patent Application No. 8-18408, an arrangement is also disclosed in which a constant-current element is connected between adjacent inverter circuits in series which are included in a ring oscillator. Thereby, it is possible to provide high-frequency oscillation using a low-voltage power source, and, also, it is possible to reduce power consumption even when a high-voltage power source is used.

In 'A 320 MHz CMOS Triple 8 bit DAC with On-Chip PLL and Hardware Cursor', David Reynolds, *IEEE JOURNAL OF SOLID-STATE CIRCUIT*, Vol. 29, No. 12, December, 1994, use of a ring oscillator is disclosed, which ring oscillator includes differential-amplifier-type inverters through each of which a steady current flows. Thereby, a VCO which performs oscillation in a wide frequency range can be obtained. By this arrangement, it is possible to reduce a signal amplitude of the VCO and reduce noise generation.

Each of power source voltages of almost all of mobile communication devices which have been used currently is 3.3 V. As mentioned above, a semiconductor chip for a mobile communication device is demanded to consume less power so as to elongate a life of a battery. Reducing a power-source voltage is effective for reducing power consumption. However, as a result of reduction of the power-source voltage, a speed of operation of a circuit decreases. As a result, it may be difficult to form a PLL circuit by CMOS, which PLL circuit generates a local frequency (on the order of 230 MHz) of an IF circuit portion. In order to obtain a distortion-free oscillation waveform of 230 MHz from a PLL circuit, a VCO needs to oscillate at a frequency double the frequency of 230 MHz.

In Japanese Laid-Open Patent Application 8-18408, a VCO is disclosed which uses voltage-controlled inverter circuits, each inverter circuit including two p-channel MOSFETs (Metal-Oxide-Semiconductor Field-Effect Transistors) and two n-channel MOSFETs connected in series. In this VCO, it is difficult to obtain 460 MHz (actually, 550 MHz, as a result of an increase by approximately 20% in consideration of a process design margin) in a stable condition using the power source of 1.5 V. Further, in this method, because the range of the oscillation voltage (double the oscillation amplitude) is the range from 0 through VCC, as shown in FIG. 6, a large amount of noise is generated, and, therefore, such a VCO is not suitable as a VCO for a PLL circuit for communication.

A VCO in which an odd number of CMOS inverter circuits are connected to form a ring is shown in FIG. 1. In the VCO shown in FIG. 1, a gate capacitance, a wiring capacitance and a drain junction capacitance are collected and replaced by an equivalent additive capacitance $C_L$. The delay time of the signal of each inverter circuit is short when the additive capacitance $C_L$ is small and charging and discharging currents are large. Thereby, the oscillation frequency is high. FIG. 2 is obtained as a result of lines for supplying a first control signal (Pcon) and a second control signal (Ncon) being added to the arrangement shown in FIG. 1.

An arrangement in which an inverter circuit shown in FIG. 3 is used is disclosed in Japanese Laid-Open Patent Application No. 8-18408. In this arrangement, the oscillation frequency varies by control signals (Pcon, Ncon) which are supplied by a VCO bias generating circuit (not shown in the figure). When IN is at a low level, by a current (Ip) supplied from VCC through two p-channel MOSFETs (P1, P2), as shown in FIG. 4A, the additive capacitance $C_L$ is charged. When IN is at a high level, by a current (In) passing through two n-channel MOSFETs (N1, N2), as shown in FIG. 4B, the additive capacitance $C_L$ is discharged. In this method, the n-channel MOSFET (N1) and p-channel MOSFET (P1) alternately perform turning on and turning off repetitively. As a result, the range of the oscillation voltage extends from 0 through VCC. That is, it is necessary to fully charge and discharge the additive capacitance $C_L$ so as to change the voltage of the additive capacitance $C_L$ between 0 and VCC. As a result, it is impossible to obtain a high oscillation frequency. In FIGS. 4A and 4B, the ON resistances of the FETs N1 and N2 are indicated by an equivalent variable resistance Rn12, and the ON resistances of the FETs P1 and P2 are indicated by an equivalent variable resistance Rp12.

In 'A 320 MHz CMOS Triple 8 bit DAC with On-Chip PLL and Hardware Cursor', David Reynolds, *IEEE JOURNAL OF SOLID-STATE CIRCUIT,* Vol. 29, No. 12, December, 1994, a method is disclosed in which, as a result of the VCO in which the differential-amplifier-type inverters are connected to form a ring being used, the amplitude of the oscillation signal decreases when the oscillation frequency increases. However, the oscillation waveform is present on the side of VCC with respect to VCC/2. A level converting circuit is needed for shifting the oscillation waveform so that the central value of the oscillation waveform is VCC/2. Thus, the circuit becomes complicated. Further, when the level converting circuit is provided, the oscillation circuit needs to have a high driving capability. Further, when symmetry of the complementary transistors of each inverter circuit is not complete, this may cause jitter.

SUMMARY OF THE INVENTION

The present invention is directed to eliminating the above-mentioned problems. An object of the present invention is to provide a voltage-controlled oscillator (VCO) which can be easily formed in one chip as a result of having an arrangement in which an odd number of inverter circuits are connected to form a ring, and, also, in which VCO, the range of the oscillation voltage is smaller than the power-source voltage, setting of the amplitude of the oscillation voltage is easy, and a high frequency higher than 500 MHz is obtained even when the power-source voltage is low. Another object of the present invention is to easily set the central value of the range of the oscillation voltage to VCC/2 without using the level converting circuit. Another object of the present invention is to provide a semiconductor integrated circuit and a phase-locked loop (PLL) circuit using the above-mentioned voltage-controlled oscillator, and an intermediate-frequency processing circuit using this phase-locked loop circuit.

A voltage-controlled oscillator, according to the present invention, in which an odd number of inverter circuits are connected with each other so as to form a ring, comprises:

a first current-control element provided between an oscillation signal line which is used for connecting adjacent inverter circuits and a power-source-potential point, a current flowing through the first current-control element varying by a first control signal; and a second current-control element provided between the oscillation signal line and a ground point, a current flowing through the second current-control element varying by a second control signal.

When this arrangement is shown so as to correspond to the diagrams shown in FIGS. 4A and 4B, a diagram shown in FIG. 5 is obtained. The current-control element 'a' acts to cause a current to always flow therethrough from the power-source-potential point VCC to a point B. The current-control element 'b' acts to cause a current to always flow therethrough from the point B to the ground point GND. Thereby, a voltage is generated between the two ends of each of the current-control elements 'a' and 'b'. Therefore, when each of the equivalent variable resistances Rp12 and Rn12 has a sufficiently high resistance value, the potential at the point B becomes neither the power source potential VCC nor the ground potential GND. For example, each of Rp12 and Rn12 is a combined ON resistance of metal-oxide-semiconductor transistors, and has a resistance value of several hundreds of Ω through several kΩ. Because the potential at the point B is equal to the potential of the additive capacitance $C_L$, the range of the oscillation voltage is smaller than the power-source voltage. This is equivalent to the matter that the apparent capacitance to be charged and discharged in the inverter circuit is reduced. Thereby, the delay time in the inverter circuit is reduced. Thus, in the voltage-controlled oscillator (VCO) having the current control elements 'a' and 'b' connected therein, the range of the oscillation voltage is defined by a potential lower than the power source potential and a potential higher than the ground potential and is thus narrow, and, thereby, the oscillation frequency increases. Further, as a result of an appropriate setting of the current-control elements 'a' and 'b', it is possible to set the central value of the output voltage of the inverter circuit to VCC/2. Therefore, an output-level converting circuit for shifting the central value of the range of the oscillation voltage to VCC/2 is not needed. Further, because the oscillation frequency increases, it is possible to obtain the oscillation frequency equal to or more than 500 MHz even when using a low power-source potential.

An art in which a current-control element is provided between adjacent inverter circuits is disclosed in Japanese Laid-Open Patent Application No. 8-18408. However, this current-control element is a constant-current element. Thus, this art is different from the present invention in which a current flowing through each current-control element varies.

Each first current-control element may include a resistance element and a p-channel metal-oxide-semiconductor transistor;

each second current-control element may include a resistance element and an n-channel metal-oxide-semiconductor transistor;

the first control signal may be input to the gate of the p-channel metal-oxide-semiconductor transistor; and the second control signal may be input to the gate of the n-channel metal-oxide-semiconductor transistor.

Each inverter circuit may include a p-channel metal-oxide-semiconductor transistor and an n-channel metal-oxide-semiconductor transistor connected between the power-source-potential point and the ground point;

a connecting point of the p-channel metal-oxide-semiconductor transistor and the n-channel metal-oxide-semiconductor transistor may be connected with a subsequent stage; and a connecting point of the gates of the p-channel metal-oxide-semiconductor transistor and the n-channel metal-oxide-semiconductor transistor may be connected with a preceding stage.

In this arrangement, the current-control elements act to reduce the range of the oscillation voltage, and also act to control the oscillation frequency.

Each inverter circuit may include a first p-channel metal-oxide-semiconductor transistor and a first n-channel metal-oxide-semiconductor transistor;

a connecting point of the first p-channel metal-oxide-semiconductor transistor and the first n-channel metal-oxide-semiconductor transistor may be connected with a subsequent stage;

a connecting point of the gates of the first p-channel metal-oxide-semiconductor transistor and the first n-channel metal-oxide-semiconductor transistor may be connected with a preceding stage;

each inverter circuit may further include a second p-channel metal-oxide-semiconductor transistor connected between the power-source-potential point and the first p-channel metal-oxide-semiconductor transistor, and a second n-channel metal-oxide-semiconductor transistor connected between the first n-channel metal-oxide-semiconductor transistor and the ground point;

the first control signal may be supplied to the gate of the second p-channel metal-oxide-semiconductor transistor; and the second control signal may be supplied to the gate of the second n-channel metal-oxide-semiconductor transistor.

It is preferable that the relationship between the current driving capabilities of the metal-oxide-semiconductor transistors of each inverter circuit and the current driving capabilities of the metal-oxide-semiconductor transistors of respective ones of the current control elements be set so that the change of the oscillation frequency is linear to the change of the voltage of each control signal.

Each inverter circuit may comprise a differential-amplifier-type inverter including three control-signal-inputting transistors and two oscillation-signal-inputting transistors;

the first control signal may be input to the gates of two of the three control-signal-inputting transistors; and the second control signal may be input to the gate of the other one of the three control-signal-inputting transistors.

A voltage-controlled oscillator, according to another aspect of the present invention, in which an odd number of inverter circuits are connected with each other so as to form a ring, comprises a first current-control element provided between an oscillation signal line which is used for connecting adjacent inverter circuits and a power-source-potential point, a current flowing through the first current-control element varying by a first control signal, or a second current-control element provided between the oscillation signal line and a ground point, a current flowing through the second current-control element varying by a second control signal.

In this arrangement, the upper limit or the lower limit of the range of the oscillation voltage is VCC or GND. Thereby, the maximum oscillation frequency is lower than that of the former-described arrangement, and also, an output level converting circuit is needed so as to shift the center of the range of the oscillation voltage to VCC/2. However, it is possible to reduce power consumption in comparison to the former-described arrangement because only one current-control element is provided for each inverter circuit.

Each first current-control element may include a resistance element and a p-channel metal-oxide-semiconductor transistor;

each second current-control element may include a resistance element and an n-channel metal-oxide-semiconductor transistor;

the first control signal may be input to the gate of the p-channel metal-oxide-semiconductor transistor; and the second control signal may be input to the gate of the n-channel metal-oxide-semiconductor transistor.

Each inverter circuit may include a first p-channel metal-oxide-semiconductor transistor and a first n-channel metal-oxide-semiconductor transistor;

a connecting point of the first p-channel metal-oxide-semiconductor transistor and the first n-channel metal-oxide-semiconductor transistor may be connected with a subsequent stage;

a connecting point of the gates of the first p-channel metal-oxide-semiconductor transistor and the first n-channel metal-oxide-semiconductor transistor may be connected with a preceding stage;

each inverter circuit may further include a second p-channel metal-oxide-semiconductor transistor connected between the power-source-potential point and the first p-channel metal-oxide-semiconductor transistor, and a second n-channel metal-oxide-semiconductor transistor connected between the first n-channel metal-oxide-semiconductor transistor and the ground point;

the first control signal may be supplied to the gate of the second p-channel metal-oxide-semiconductor transistor; and the second control signal may be supplied to the gate of the second n-channel metal-oxide-semiconductor transistor.

Each inverter circuit may comprise a differential-amplifier-type inverter including three control-signal-inputting transistors and two oscillation-signal-inputting transistors;

the first control signal may be input to the gates of two of the three control-signal-inputting transistors; and the second control signal may be input to the gate of the other one of the three control-signal-inputting transistors.

It is preferable that each resistance element comprises one of a well resistance and a non-doped polysilicon resistance.

Transistors of each inverter circuit may comprise depletion-type transistors.

A semiconductor integrated circuit, according to another aspect of the present invention, comprises any of the above-described voltage-controlled oscillators, wherein the voltage-controlled oscillator and other components are provided on one semiconductor substrate.

A phase-locked loop circuit, according to another aspect of the present invention, comprises:

any of the above-described voltage-controlled oscillators;

a control-voltage generating circuit which supplies the control signals to the voltage-controlled oscillator;

a divider which lowers the oscillation frequency output from the voltage-controlled oscillator; and a phase comparator which compares the signal from the divider with a reference signal, and provides the comparison result to the control-voltage generating circuit, wherein the voltage-controlled oscillator, the control-voltage generating circuit, the divider and the phase comparator are provided on one semiconductor substrate.

An intermediate-frequency processing circuit, according to another aspect of the present invention, comprises:

a mixer for converting a frequency;

the above-described phase-locked loop circuit which provides an oscillation signal, the frequency of which is converted by the mixer;

an amplifier which amplifies the signal output by the mixer; and a modulating and demodulating circuit connected with the amplifier, wherein the mixer, the phase-locked loop circuit, the amplifier and the modulating and demodulating circuit are provided on one semiconductor substrate.

Thus, because the voltage-controlled oscillator according to the present invention uses the inverter circuits, it is possible to form the voltage-controlled oscillator by CMOS or the like and it is easy to form the voltage-controlled oscillator in one chip. Generally speaking, when a voltage-controlled oscillator is formed in one chip, noise generated by the voltage-controlled oscillator is a problem. However, in the voltage-controlled oscillator according to the present invention, it is possible to narrow the range of the oscillation voltage and, thus, to reduce noise. Thus, when the voltage-controlled oscillator is formed in one chip, the problem of noise can be avoided. Further, as a result of the range of the oscillation voltage being narrowed, the operation speed can be increased, and, thereby, it is easy to increase the oscillation frequency. Further, because it is possible to increase the operation speed, even when the operation speed decreases to a certain extent as a result of the power-source voltage being reduced, it is possible to obtain a necessary high oscillation frequency. Thus, it is possible to reduce the power-source voltage while a desired high oscillation frequency is provided. Thereby, it is also possible to reduce power consumption.

In the voltage-controlled oscillator in which the two current-control elements are provided for each inverter circuit, it is possible to narrow the range of the oscillation voltage, in comparison to the voltage-controlled oscillator in which the one current-control element is provided for each inverter circuit, and also, it is easy to set the central potential of the oscillation signal to half the power-source voltage. On the other hand, in the voltage-controlled oscillator in which the one current-control element is provided for each inverter circuit, it is possible to reduce power consumption in comparison to the voltage-controlled oscillator in which the two current-control elements are provided for each inverter circuit.

When control of the oscillation frequency is performed by the MOS transistors of the current-control elements, it is possible to reduce the number of components. On the other hand, when control of the oscillation frequency is performed by both the MOS transistors of the inverter circuits and the MOS transistors of the current-control elements, it is possible to lower the lowest value of the oscillation frequency, and also, it is possible to provide superior linearity of the control-voltage dependence characteristics of the oscillation frequency.

When the resistance elements of the current-control elements comprise resistance elements each having a high sheet resistance such as a well resistance or a non-doped polysilicon resistance, it is possible to reduce the area of each current-control element. Further, because it is possible to reduce the parasitic capacitance of each resistance element, it is possible to avoid a decrease of the oscillation frequency and stoppage of oscillation due to increase of the parasitic capacitance.

When the MOS transistors of each inverter circuit comprise depletion-type transistors, the delay time of the inverter circuit itself is shortened, and, thus, it is possible to increase the oscillation frequency in comparison to the case where enhancement-type transistors are used.

Because generation of noise is reduced in the above-described voltage-controlled oscillators, the operation reliability of the semiconductor integrated circuit and the phase-locked loop circuit in which one of these voltage-controlled oscillators and other circuits are formed on one semiconductor substrate is very high. Further, the operation reliability of the intermediate-frequency processing circuit in which this phase-locked loop circuit and other circuits are formed on one semiconductor substrate is very high.

Other objects and further features of the present invention will become more apparent from the following detailed description when read in conjunction with the accompanying drawings.

DETAILED DESCRIPTION OF THE PREFERRED EMBODIMENTS

A voltage-controlled oscillator in a first embodiment of the present invention has an arrangement in which an odd number of inverter circuits are connected so as to form a ring. Further, a first current-control element is provided between an oscillation signal line, which is used for connecting adjacent inverter circuits, and a point (VCC) to which a power-source potential (VCC) is applied. The current flowing through the first current-control element varies by a first control signal. A second current control element is provided between the above-mentioned oscillation signal line and a point (GND) which is grounded. The current flowing through the second current-control element varies by a second control signal.

Figure 7A:
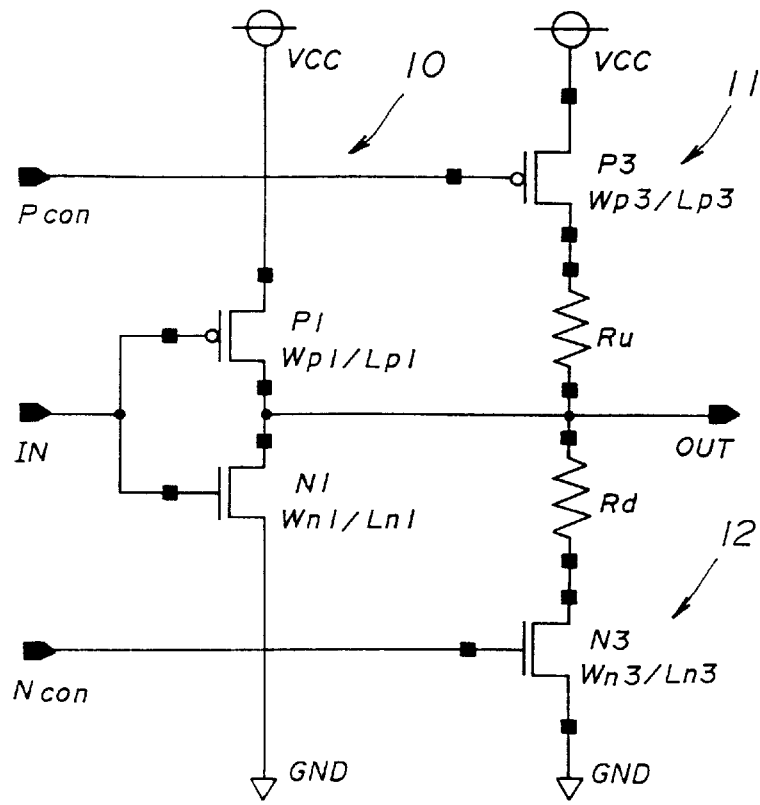
FIG. 7A is a circuit diagram showing one inverter circuit portion in a first embodiment of the present invention.

FIG. 7A shows a circuit diagram of one inverter circuit 10 of the odd number of inverter circuits 10 which are connected with each other so as to form the ring (ring oscillator), the first current-control element 11 and the second current-control element 12, of the voltage-controlled oscillator in the first embodiment. The first and second current-control elements 11 and 12 are provided for each inverter circuit 10.

The inverter circuit 10 includes a p-channel MOSFET P1 and an n-channel MOSFET N1 connected between VCC and GND in series. The connection point between the two FETs P1 and N1 is an oscillation-signal outputting point (OUT) to a subsequent-stage inverter circuit (not shown in the figure). The connection points of the gates of the two FETs P1 and N1 is an oscillation-signal inputting point (IN) from a preceding-stage inverter circuit (not shown in the figure).

The first current-control element 11 includes a resistance element Ru (the resistance value of which is also referred to as Ru) and a p-channel MOSFET P3. The second current-control element 12 includes a resistance element Rd (the resistance value of which is also referred to as Rd) and an n-channel MOSFET N3. The first control signal (Pcon) is input to the gate of the p-channel MOSFET P3. The second control signal (Ncon) is input to the gate of the n-channel MOSFET N3.

Figure 5:
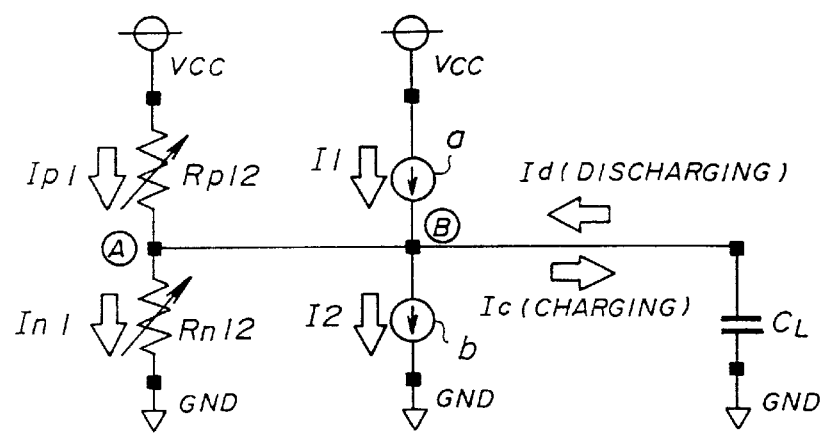
FIG. 5 is a basic circuit diagram showing one inverter circuit portion in a voltage-controlled oscillator according to the present invention.
Figure 6:
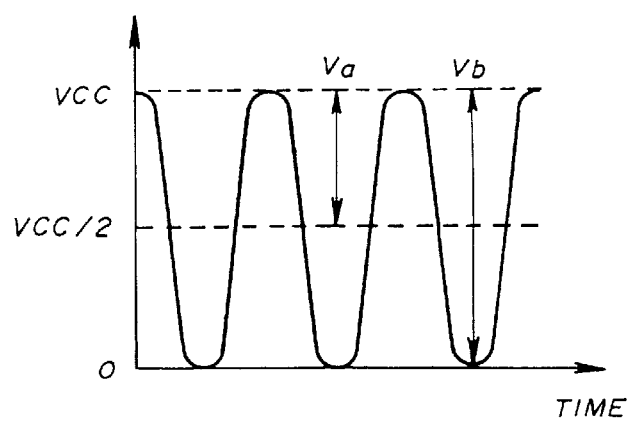
FIG. 6 is a graph showing an oscillation amplitude Va and a range Vb of an oscillation voltage in a voltage-controlled oscillator using the inverter circuit shown in FIG. 3.
Figure 7B:
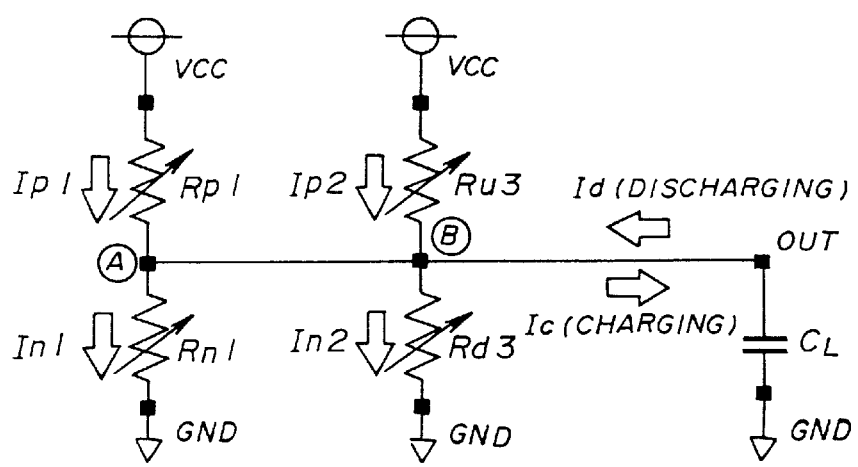
FIG. 7B is an equivalent circuit diagram of the circuit diagram shown in FIG. 7A.

FIG. 7B shows an equivalent circuit diagram which describes the circuit diagram shown in FIG. 7A so as to correspond to the circuit diagram shown in FIG. 5. In the equivalent circuit diagram shown in FIG. 7B, the resistance value of the p-channel MOSFET P1 is referred to as Rp1, the resistance value of the n-channel MOSFET N1 is referred to as Rn1, the combined resistance of the p-channel MOSFET P3 and the resistance element Ru is referred to as Ru3 (the resistance value of which is also referred to as Ru3), and the combined resistance of the n-channel MOSFET N3 and the resistance element Rd is referred to as Rd3 (the resistance value of which is also referred to as Rd3). Further, the current flowing through the p-channel MOSFET P1 is referred to as Ip1, the current flowing through the n-channel MOSFET N1 is referred to as In1, the current flowing through the combined resistance Ru3 is referred to as Ip2 and the current flowing through the combined resistance Rd3 is referred to as In2. Further, the discharging current is referred to as Id and the charging current is referred to as Ic.

The potential at the point A, the potential at the point B and the potential (Vout) at the point OUT shown in FIG. 7B are the same potential assuming that the wiring resistance is zero. The parallel combined resistance of Rp1 and Ru3 is referred to as Ra, and the parallel combined resistance of Rn1 and Rd3 is referred to as Rb. Then, the following equations hold:

$$Vout = VCC \cdot Rb/(Ra+Rb) \quad (1)$$

$$Ra = Rp1 \cdot Ru3/(Rp1+Ru3) \quad (2)$$

$$Rb = Rn1 \cdot Rd3/(Rn1+Rd3) \quad (3)$$

The resistance value of each of Rp1 and Rn1 may be infinite due to turning on and turning off operations by change of the input signal. However, the control signals (Pcon and Ncon) are signals which do not cause the MOSFETs P3 and N3 to turn off, respectively. Therefore, each of Ru3 and Rd3 always has a value which is a finite value more than zero. Accordingly, each of the parallel combined resistances Ra and Rb also has a value which is a finite value more than zero. As a result, Vout varies but has a value more than zero and less than VCC. Thus, the range of the oscillation voltage is narrower than the power-source voltage VCC. The central value of the range of the oscillation voltage is the DC operating point at a time of oscillation stoppage, and it is preferable to set the central value of the range of the oscillation voltage to the logical inverting voltage (Vinv) of an inverter circuit which is connected to the output of the VCO. Ordinarily, the central value of the range of the oscillation voltage is set to VCC/2 as a result of the resistance values and the size of each FET being set to the optimum ones. For this purpose, it should be that Ru=Rd.

When the input signal is at a high level (Vin>Vinv), the MOSFET P1 is in an approximately OFF condition. As a result, Ra≈Ru3. This is the maximum value of Ra. At this time, the resistance of the MOSFET N1 is minimum. Thus, Rb is minimum. Because Ra is maximum and Rb is minimum, the value of Vout which is determined by the values of Ra and Rb is minimum (lowest). When the input signal is at a low level (Vin<Vinv), the MOSFET N1 is in an approximately OFF condition. As a result, Rb≈Rd3. This is the maximum value of Rb. At this time, the resistance of the MOSFET P1 is minimum. Thus, Ra is minimum. Because Rb is maximum and Ra is minimum, the value of Vout which is determined by the values of Ra and Rb is maximum (highest).

Thus, in the circuit in the first embodiment, the inverter operation is performed in the range of the oscillation voltage narrower than the power-source voltage VCC. Thereby, the apparent additive capacitance $C_L$ is small, and, as a result, the oscillation frequency is high. The oscillation frequency is controlled as a result of the ON resistance (Rp3) of the MOSFET P3 and the ON resistance (Rn3) of the MOSFET N3 being changed by the values of the control signals (Pcon and Ncon), respectively. It is necessary to always cause currents to flow through the current control elements 11 and 12, respectively. For this purpose, assuming that the threshold voltages of the MOSFET N3 and the MOSFET P3 are Vthn and Vthp, respectively, it is necessary that Ncon>Vthn, and Pcon<VCC−|Vthp|. The maximum oscillation frequency is obtained when Pcon=0, and Ncon=VCC. At this time, it is necessary to prevent the oscillation from stopping. For this purpose, design is performed as follows:

When the above description is applied to the equation (1), the maximum value and the minimum value of the range of the oscillation voltage are obtained from the following equations:

$$Vout(max) = VCC \cdot Rd3/(Ra+Rd3) = VCC/(1+Ra/Rd3) \quad (4)$$

$$Vout(min) = VCC \cdot Rb/(Ru3+Rb) = VCC/(1+Ru3/Rb) \quad (5)$$

From the above equations, it is seen that Ra/Rd3 should be large and Ru3/Rb should be small so that the range of the oscillation voltage is narrowed. This is equivalent to causing each of Rd3·(1/Rp1+1/Ru3) and Ru3·(1/Rn1+1/Rd3) to be small, from the equations (2) and (3). Further, in order to set the central value of the range of the oscillation voltage to VCC/2, it should be that Rd3≈Ru3. Therefore, Ra/Rd3 and Rb/Ru3 are obtained from the following equations:

$$Ra/Rd3 = 1/(1+Rd3/Rp1) \quad (6)$$

$$Rb/Ru3 = 1/(1+Ru3/Rn1) \quad (7)$$

Consequently, each of Rd3/Rp1 and Ru3/Rn1 is set to be small, that is, design is performed so that the currents (Ip2, In2) flowing through the current control elements (P3, Ru, Rd, N3), respectively, be larger than the currents (Ip1, In1) flowing through the inverter circuit 10 (P1, N1), respectively. Thereby, a high oscillation frequency can be obtained.

For this purpose, in order to cause each of the resistance values Rp1 and Rn1 to be high, for example, each of the gate widths (Wp1 and Wn1) of the MOSFETs P1 and N1 may be caused to be small. However, thereby, the current driving capability of the inverter circuit itself decreases and the oscillation frequency decreases. Therefore, a better method is to cause each of Rd3 and Ru3 to be small, instead. As mentioned above, Ru3 is the combined resistance of the MOSFET P3 and the resistance element Ru, and Rd3 is the combined resistance of the MOSFET N3 and the resistance element Rd. Because the MOSFETs P3 and N3 are the control transistors, the range of the oscillation frequency becomes narrow when the resistances thereof are excessively lowered. Further, when the gate widths of the MOSFETs P3 and N3 are increased, the junction capacitances thereof become large. Thereby, the additive capacitance ($C_L$) of the inverter circuit increases, and the oscillation frequency is lowered. Therefore, to cause each of Ru and Rd to be small is effective in setting of the maximum oscillation frequency. However, when each of Ru and Rd is caused to be excessively small and, thereby, the range of the oscillation voltage is excessively narrowed, it becomes impossible to drive a subsequent stage and, thus, the oscillation is stopped. Therefore, Rd and Ru should be set to the optimum values in consideration of set values of other elements.

Operation of the circuit shown in FIG. 7A has been confirmed by using circuit simulation. For comparison, simulation has been also performed for the voltage-controlled oscillator using the inverter circuit shown in FIG. 3. The sizes of the respective transistors and the resistance values of the resistances used in the simulation are shown in the following table:

|      | N1<br>Wn1/Ln1 | P1<br>Wp1/Lp1 | N2<br>Wn2/Ln2 | P2<br>Wp2/Lp2 | N3<br>Wn3/Lp3 | P3<br>Wn3/Ln3 | Ru | Rd |
|------|---------------|---------------|---------------|---------------|---------------|---------------|-----|-----|
| INV1 | 2 u/0.35 u | 6 u/0.35 u | 10 u/0.5 u | 30 u/0.5 u | — | — | | |
| INVR | 2 u/0.35 u | 6 u/0.35 u | — | — | 2 u/0.35 u | 6 u/0.35 u | 4 k | 4 k |

Figure 1:
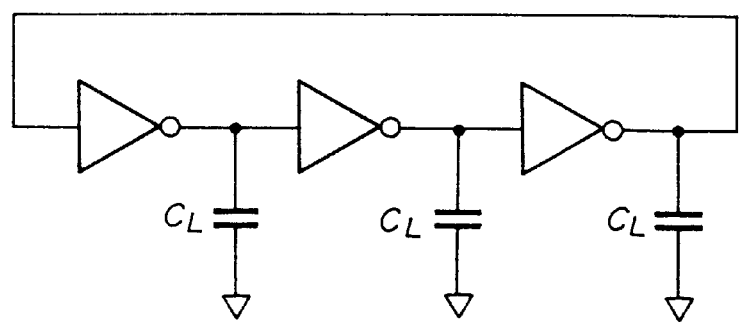
FIG. 1 is a symbolic diagram showing a general basic arrangement of a voltage-controlled oscillator including an odd number of inverter circuits.
Figure 2:
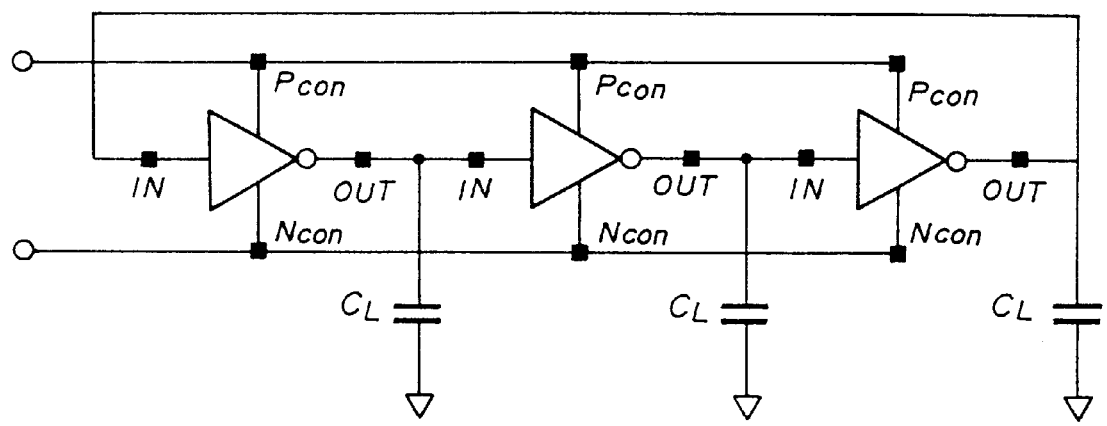
FIG. 2 is a symbolic diagram showing a detailed basic arrangement of a voltage-controlled oscillator including an odd number of inverter circuits.
Figure 3:
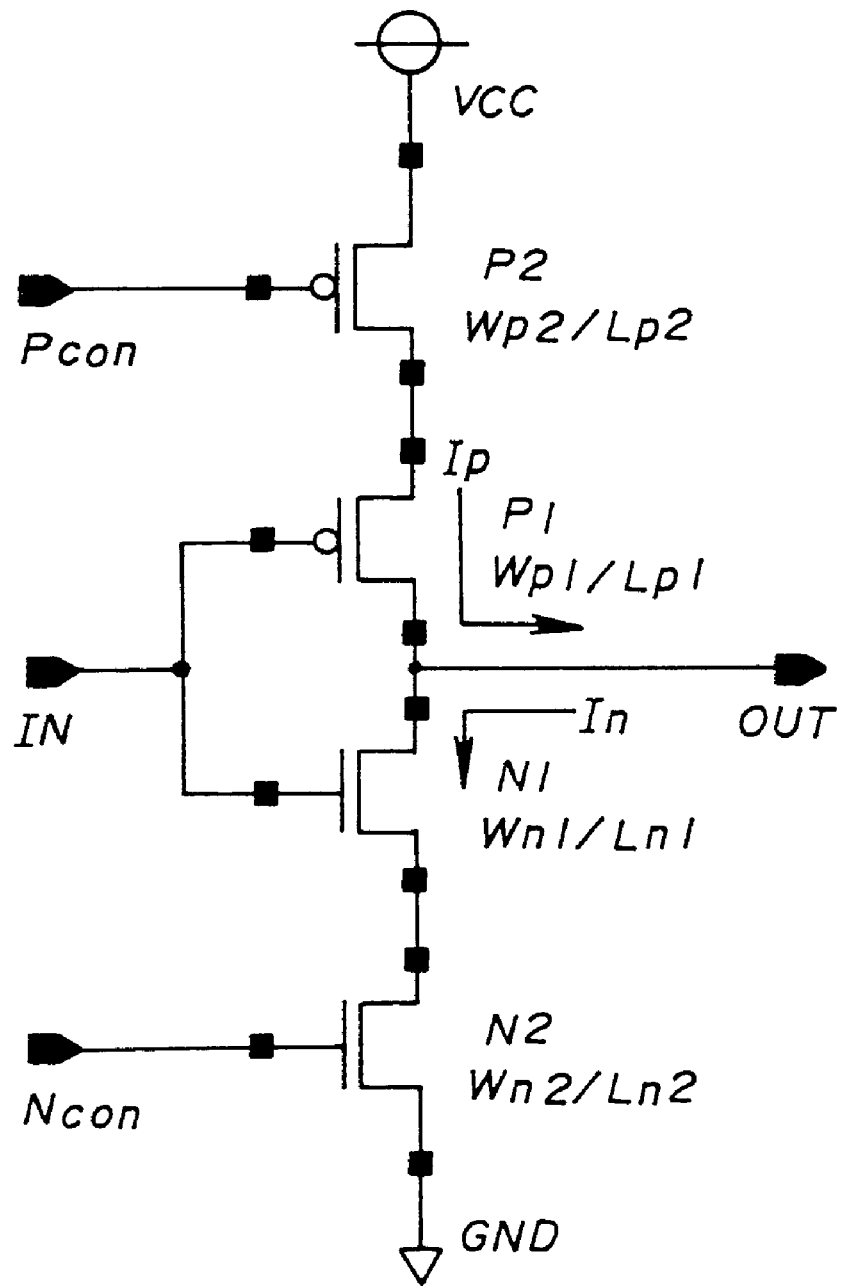
FIG. 3 is a circuit diagram showing a general inverter circuit used in a voltage-controlled oscillator.
Figure 4A:
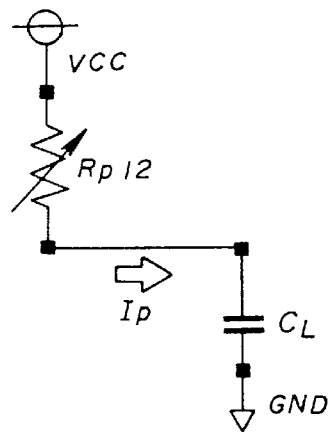
FIGS. 4A and 4B illustrate an oscillation operation principle of a voltage-controlled oscillator using the inverter circuit shown in FIG. 3.
Figure 4B:
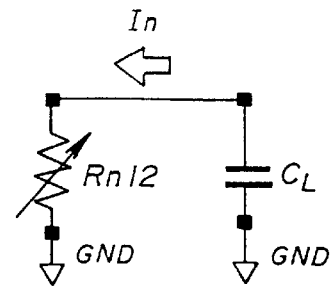

In the above table, INV1 represents the voltage-controlled oscillator using the inverter circuit shown in the FIG. 3, and INVR represents the voltage-controlled oscillator using the circuit shown in FIG. 7A. Further, 'u' represents μm, and 'k' represents kΩ. W represents the gate width of each transistor, and L represents the gate length of each transistor.

Figure 8A:
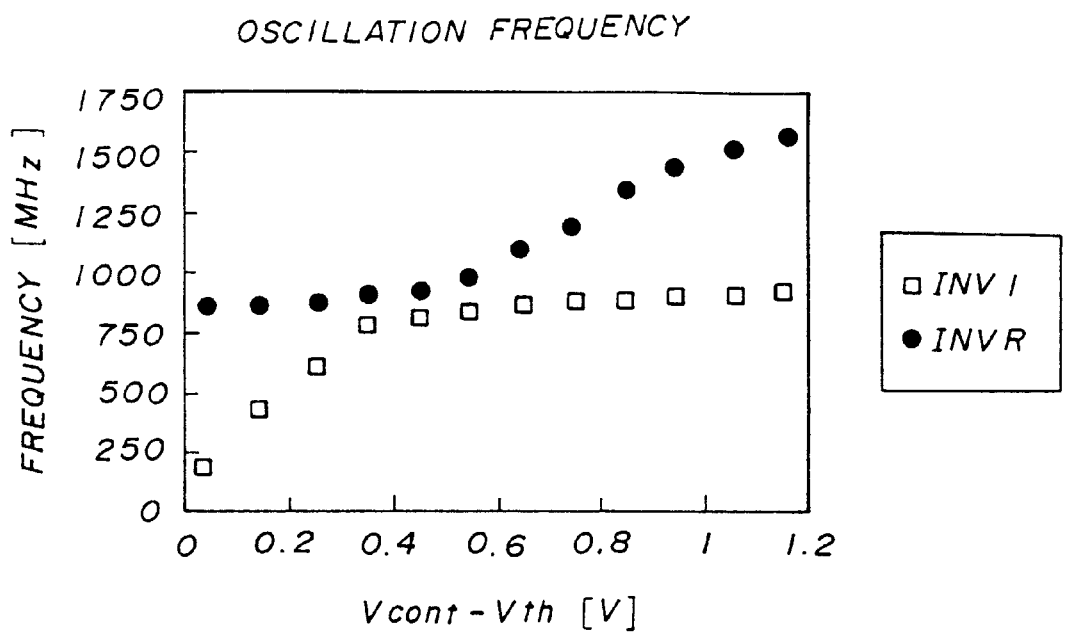
FIGS. 8A and 8B are graphs showing results of simulation of the voltage-controlled oscillator in the first embodiment of the present invention using the circuit shown in FIG. 7A, and results of simulation of the voltage-controlled oscillator using the inverter circuit shown in FIG. 3, for comparison.
Figure 8B:
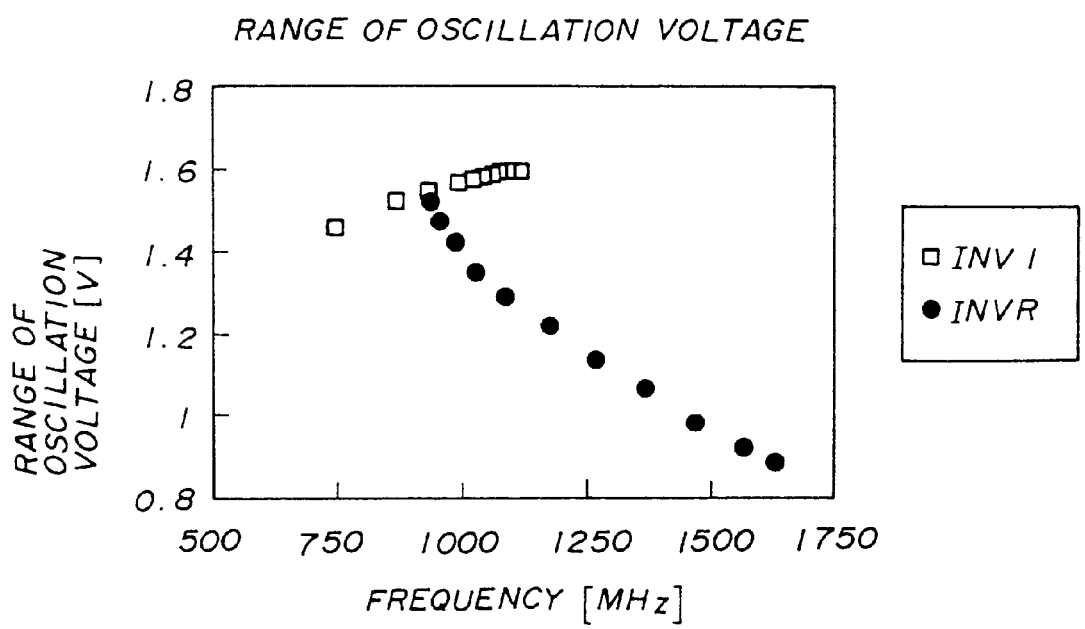

The number of stages of each VCO is five, and the power-source voltage VCC of each VCO is 1.5 V. Further, the threshold voltage (Vth) of each of the n-channel MOSFETs and p-channel MOSFETs is set to 0.35 V. The control voltages (Ncon and Pcon) are set so that Pcon=VCC −Ncon so that the control voltages are symmetrical with respect to the voltage VCC/2. Then, Ncon (Vcont) is changed through the range between 0 and 1.5 V, and the oscillation frequency and the range of the oscillation voltage are obtained through the simulation. FIGS. 8A and 8B are graphs showing the results thereof. The maximum oscillation frequency in the VCO (INV1) using the inverter circuit shown in FIG. 3 is 1.0 GHz, while the maximum oscillation frequency in the VCO (INVR) in the first embodiment is 1.6 GHz. Further, the minimum range of the oscillation voltage is on the order of 0.9 V in the first embodiment. In this simulation, the parasitic capacitance which affects the oscillation frequency is not considered. Therefore, the oscillation frequencies obtained from the simulation are higher than the actual values by a value on the order of 20% through 30%, respectively. When this matter is considered, an oscillation frequency on the order of 1.2 GHz is obtained in the VCO in the first embodiment using CMOS of the power-source voltage VCC of 1.5 V.

Figure 9:
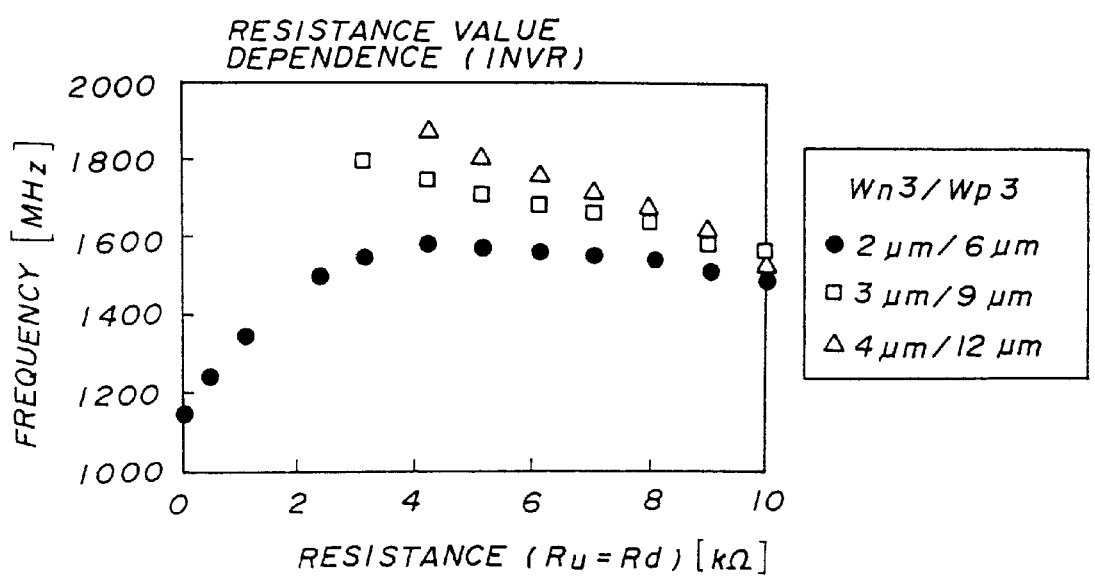
FIG. 9 is a graph showing results of simulation of resistance-dependent characteristics of an oscillation frequency when three sizes of controlling MOS transistors are set in the voltage-controlled oscillator in the first embodiment of the present invention using the circuit shown in FIG. 7A.

The resistance values Ru and Rd should be set to the optimum values as mentioned above. In order to confirm the presence of the optimum values, a simulation has been performed where the resistance value (Ru=Rd) is changed. In this simulation, the relationship between the resistance value and the oscillation frequency (the maximum value where Vcont=1.5 V) has been obtained. In this simulation, three sets (●, □, ∆) of the sizes (gate widths: Wn3/Wp3) of the control transistors (N3/P3) have been set. FIG. 9 is a graph showing the result of the simulation. When the sizes of the control transistors (N3/P3) are increased, the range of the oscillation voltage becomes small as the currents flowing therethrough increase, and the oscillation frequency becomes high when comparison is performed for the same resistance of Ru and Rd, as shown in the figure. However, the oscillation stops when the resistance value (Ru=Rd) is low, when the sizes of the control transistors (N3/P3) are large, as shown in the figure (□, ∆)In the case where the sizes of the transistors are smallest, that is, Wn3/Wp3=2 μm/6 μm (●), the oscillation continues when the resistance (Ru=Rd) is low. However, in this case, the oscillation frequency peaks for the resistance value Ru=Rd=4 kΩ, and sharply decays for a smaller resistance value than the above value. It can be determined that the first embodiment is sufficiently advantageous in that, despite simulation errors and variation of factors of elements due to the manufacturing process, an oscillation frequency higher than that (1 GHz) of the prior art by a value on the order of 30% is obtained. Therefore, it is preferable that the resistance value (Ru=Rd) be equal to or higher than 1 kΩ.

The DC operating voltage at the point B (shown in FIG. 7B) is determined by the ratio of the values of the resistances (Ru, Rd) on the two sides of the point B, and it is preferable that Ru=Rd so that the central value of the range of the oscillation voltage is VCC/2, as mentioned above. When the central value of the range of the oscillation voltage is equal to the logical inverting voltage of an inverter circuit which is connected to the output of the VCO, a level converting circuit, which is needed in a differential-amplifier-type VCO disclosed in 'A 320 MHz CMOS Triple 8 bit DAC with On-Chip PLL and Hardware Cursor', David Reynolds, *IEEE JOURNAL OF SOLID-STATE CIRCUIT*, Vol. 29, No. 12, December, 1994, is not needed. When it is considered that some variation of the resistance values Ru, Rd due to variation of various factors occurring in a manufacturing process can be permitted, it is preferable that the following condition be fulfilled:

$$VCC/3 \leq VB \leq VCC \cdot 2/3 \qquad (8)$$

where VB=Vout=VCC·Rd/(Ru+Rd).

When the ratio of Ru and Rd is obtained from the above condition, $$0.5 \leq Ru/Rd \leq 2 \qquad (9)$$

When resistance elements are provided in a chip of a semiconductor integrated circuit, one of a well resistance, a diffusion resistance and a polysilicon resistance is appropriately selected to be used for a particular use. Although the sheet resistance value of each resistance somewhat varies depending on conditions of a manufacturing process, the sheet resistance value of each resistance is as follows:

1) well resistance: 1–2 kΩ/sq 2) diffusion resistance: 50–200 Ω/sq 3) polysilicon resistance (doped): 15–40 Ω/sq 4) polysilicon resistance (non-doped): 200–500 9/sq Among these resistances, each of the sheet resistance values of 2) diffusion resistance and 3) polysilicon resistance (doped) is small so that a large area of resistance is required to obtain a high resistance value on the order of several kΩ. When a large area of resistance is formed, the additive capacitance $C_L$ increases, the oscillation frequency is lowered and the oscillation may stop. Therefore, it is not preferable to use 2) diffusion resistance or 3) polysilicon resistance (doped). It is preferable to use 1) well resistance or 4) polysilicon resistance (non-doped), each of which has the high sheet resistance.

In the control-voltage dependence characteristics of the oscillation frequency, it is preferable that linearity of the oscillation frequency be maintained through the entire range of the control voltage. However, in the first embodiment, as it can be seen from FIG. 8A, the oscillation frequency is not linear through the entire range of the control voltage. In the first embodiment (INVR), the linearity of the oscillation frequency is maintained only through the range of the control voltage between 0.5 and 1.15 V. In contrast to this, in the prior art (INV1), the linearity of the oscillation frequency is maintained only through the range of the control voltage other than the range between 0.5 and 1.15 V. In a second embodiment of the present invention, both the linear range of INVR and the linear range of INV1 can be used.

Figure 10A:
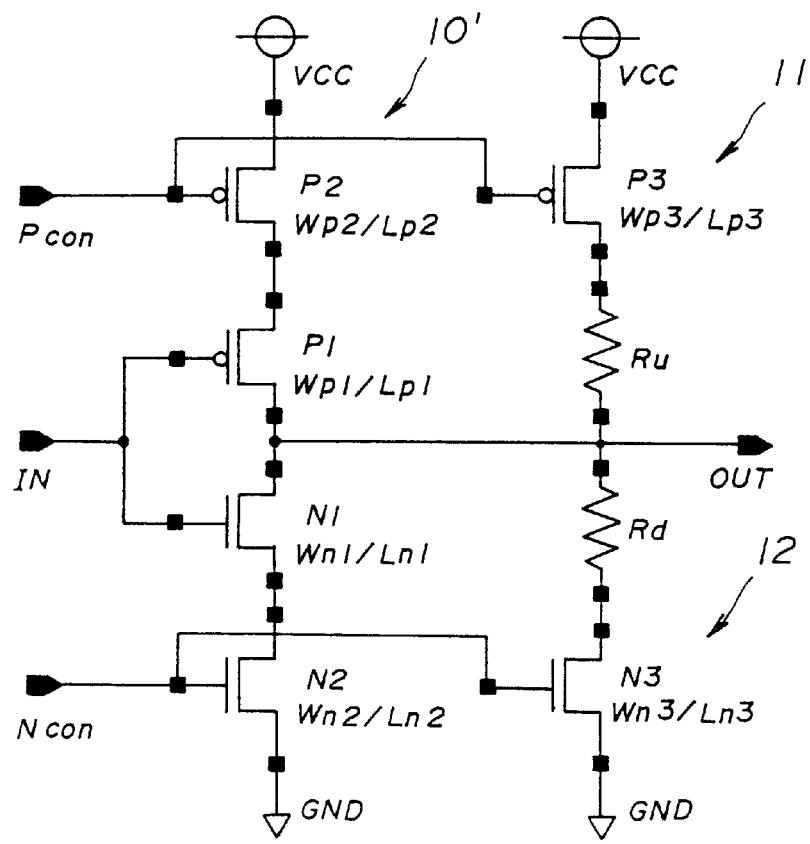
FIG. 10A is a circuit diagram showing one inverter circuit portion in a second embodiment of the present invention.

FIG. 10A is a circuit diagram showing one inverter circuit 10' of an odd number of inverter circuits 10' which are connected with each other so as to form a ring (ring oscillator), a first current-control element 11 and a second current-control element 12,in a voltage-controlled oscillator in the second embodiment. The first and second current-control elements 11 and 12 are provided for each inverter circuit 10'. The first and second current-control elements 11 and 12 are similar to those of the first embodiment, and, therefore, a description thereof will be omitted.

The inverter circuit 10' includes second and first p-channel MOSFETs P2 and P1, and first and second n-channel MOSFETs N1 and N2 connected in series between VCC and GND in the stated order as shown in FIG. 10A. The connection point of MOSFETs P1 and N1 is an oscillation-signal outputting point (OUT) connected to a subsequent stage and the connection point of the gates of the MOSFETs P1 and N1 is an oscillation-signal inputting point (IN) connected to a preceding stage. The gate of the MOSFET P2 is connected to the supply line of the first control signal (Pcon). The gate of the MOSFET N2 is connected to the supply line of the second control signal (Ncon).

Figure 10B:
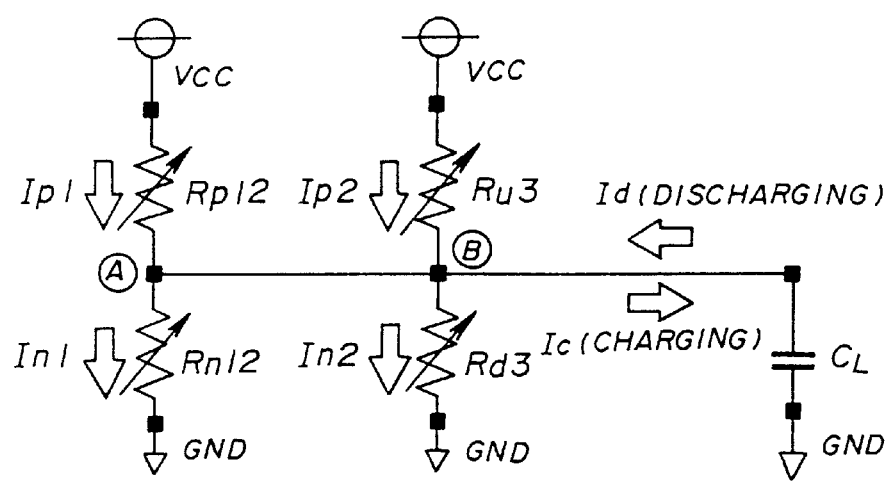
FIG. 10B is an equivalent circuit diagram of the circuit diagram shown in FIG. 10A.

FIG. 10B shows an equivalent circuit diagram which describes the circuit diagram shown in FIG. 10A so as to correspond to the circuit diagram shown in FIG. 5. In the equivalent circuit diagram shown in FIG. 10B, the combined resistance of the p-channel MOSFETs P1 and P2 is referred to as Rp12 (the resistance value of which is also referred to as Rp12), the combined resistance of the n-channel MOSFETs N1 and N2 is referred to as Rn12 (the resistance value of which is also referred to as Rn12), the combined resistance of the p-channel MOSFET P3 and the resistance element Ru is referred to as Ru3 (the resistance value of which is also referred to as Ru3), and the combined resistance of the n-channel MOSFET N3 and the resistance element Rd is referred to as Rd3 (the resistance value of which is also referred to as Rd3). Further, the current flowing through the combined resistance Rp12 is referred to as Ip1, the current flowing through the combined resistance Rn12 is referred to as In1, the current flowing through the combined resistance Ru3 is referred to as Ip2 and the current flowing through the combined resistance Rd3 is referred to as In2. Further, the discharging current is referred to as Id and the charging current is referred to as Ic.

In the arrangement shown in FIG. 10A, when the control voltage (Vcont=Ncon, where Pcon=VCC−Ncon) is low, each of the ON resistances of the control MOSFETs N3 and P3 is large, and, thereby, the current flowing therethrough is small. As a result, the characteristics of the circuit shown in FIG. 10A is approximately equal to the characteristics of the circuit which only includes the inverter circuit 10' (that is, the prior art INV1). When the control voltage (Vcont=Ncon, where Pcon=VCC−Ncon) is high, each of the ON resistances of the control MOSFETs N2 and P2 of the inverter circuit is small. As a result, the characteristics of the circuit shown in FIG. 10A is approximately equal to the characteristics of the circuit which only includes the MOSFETs P1, N1 and the first and second control elements 11 and 12 (that is, the first embodiment INVR). Therefore, when the arrangement shown in FIG. 10A is used, and the sizes of the transistors are set to the optimum ones, it is possible to obtain the VCO in which the linearity of the oscillation frequency is maintained through a wide range of the control voltage.

Operations of the circuit shown in FIG. 10A has been confirmed by using circuit simulation. The sizes of the respective transistors and the resistance values of the resistances used in the simulation are shown in the following table:

|  | N1 Wn1/Ln1 | P1 Wp1/Lp1 | N2 Wn2/Ln2 | P2 Wp2/Lp2 | N3 Wp3/Lp3 | P3 Wn3/Ln3 | Ru | Rd |
|---|---|---|---|---|---|---|---|---|
| INV1 | 2 u/0.35 u | 6 u/0.35 u | 10 u/0.5 u | 30 u/0.5 u | — | — | | |
| INVR | 2 u/0.35 u | 6 u/0.35 u | — | — | 2 u/0.35 u | 6 u/0.35 u | 4 k | 4 k |
| INVRT | 2 u/0.35 u | 6 u/0.35 u | 10 u/0.5 u | 30 u/0.5 u | 2 u/0.35 u | 6 u/0.35 u | 4 k | 4 k |

In the above table, INV1 represents the voltage-controlled oscillator using the inverter circuit shown in FIG. 3, INVR represents the voltage-controlled oscillator using the circuit shown in FIG. 7A, and INVRT represents the voltage-controlled oscillator using the circuit shown in FIG. 10A. Further, 'u' represents $\mu$m, and 'k' represents k$\Omega$. W represents the gate width of each transistor, and L represents the gate length of each transistor.

Figure 11A:
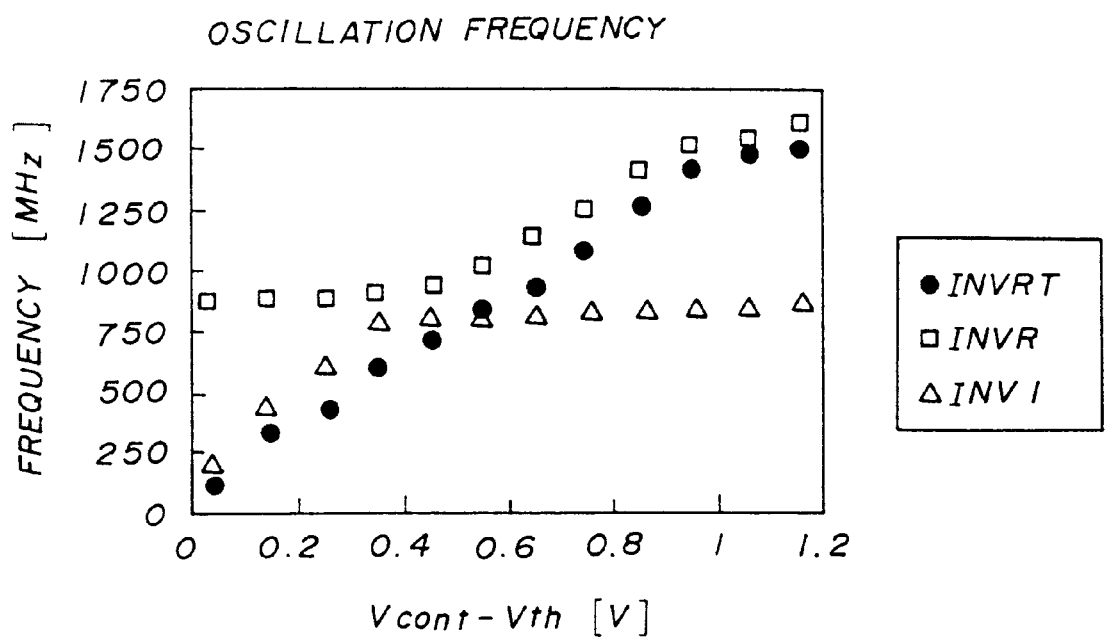
FIGS. 11A and 11B are graphs showing results of simulation of the voltage-controlled oscillator in the second embodiment of the present invention using the circuit shown in FIG. 10A, and results of simulation of the voltage-controlled oscillators using the inverter circuit shown in FIG. 3 and the circuit shown in FIG. 7A, respectively, for comparison.
Figure 11B:
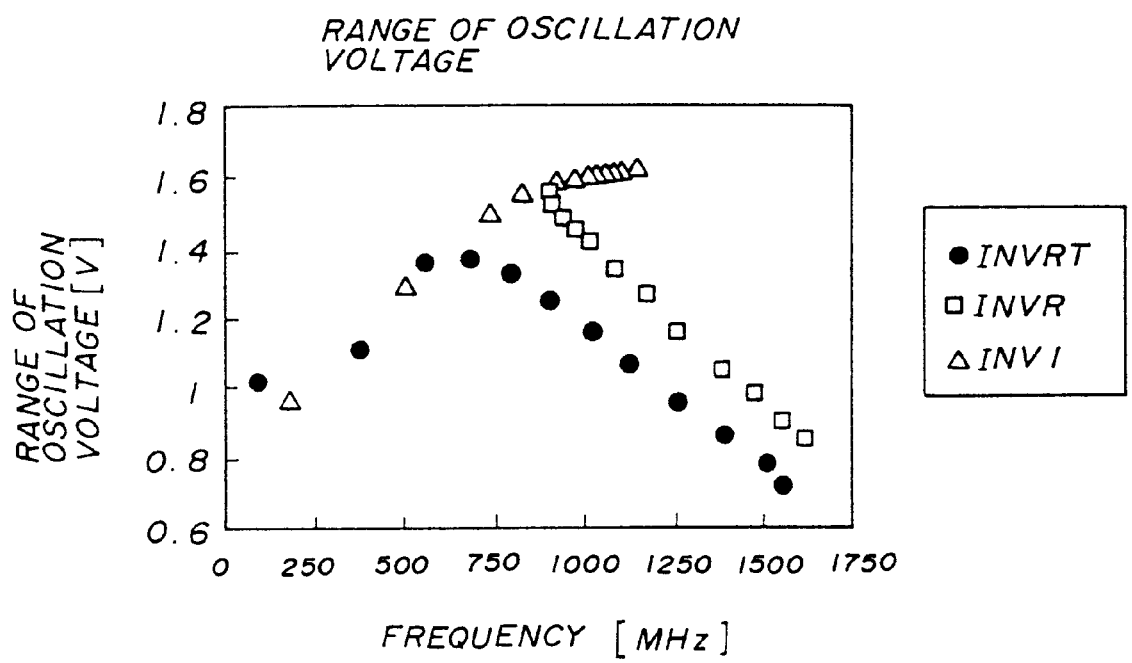

The number of stages of each VCO is five, the power-source voltage VCC of each VCO is 1.5 V. Further, the threshold voltage (Vth) of each of the n-channel MOSFETs and p-channel MOSFETs is set to 0.35 V. The control voltage (Ncon and Pcon) are set so that Pcon=VCC−Ncon so that the control voltages are symmetrical with respect to the voltage VCC/2. Then, Ncon (Vcont) is changed through the range between 0 and 1.5 V, and the control-voltage dependence characteristics of the oscillation frequency and the relationship between the oscillation frequency and the range of the oscillation voltage are obtained through the simulation. The control-voltage dependence characteristics of the oscillation frequency are shown in FIG. 11A and the relationship between the oscillation frequency and the range of the oscillation voltage is shown in FIG. 11B. INVRT represents the result of the simulation performed for the VCO using the circuit shown in FIG. 10A in the second embodiment. For comparison, the result (represented by INV1) of the simulation performed for the voltage-controlled oscillator using the inverter circuit shown in FIG. 3 in the prior art, and the result (represented by INVR) of simulation performed for the voltage-controlled oscillator using the circuit shown in FIG. 7A in the first embodiment are also shown in the graphs of FIGS. 11A and 11B. As shown in FIG. 11A, approximately linear characteristics of the oscillation frequency are obtained through the range of Vcont−Vth between 0 and 1.15 V (that is, the Vcont between 0.35 and 1.5 V). Further, as shown in FIG. liB, the range of the oscillation frequency of INVRT extends through both the range of the oscillation frequency of INV1 and the range of the oscillation frequency of INVR.

Figure 12:
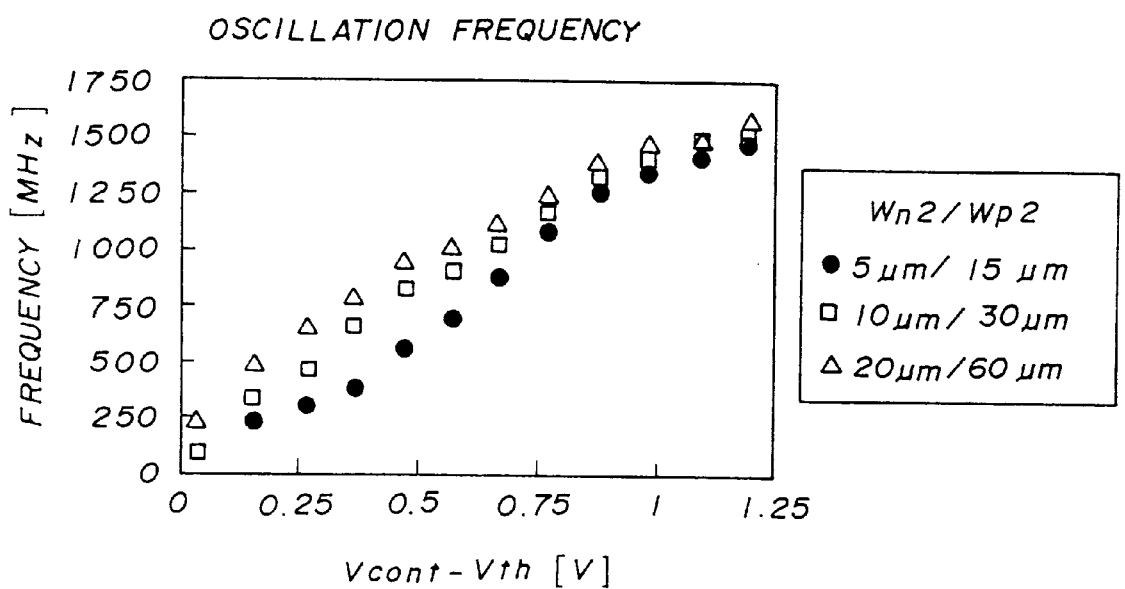
FIG. 12 is a graph showing results of simulation of oscillation frequency characteristics with respect to a control voltage when three sizes of controlling MOS transistors are set in the voltage-controlled oscillator in the second embodiment of the present invention using the circuit shown in FIG. 10A.

FIG. 12 is a graph showing the results of simulation using the control transistors N2 and P2 of the inverter circuit 10' having three sets of gate widths Wn2 and Wp2, respectively. As shown in the figure, the linearity of the oscillation frequency to the control voltage is inferior in the cases of Wn2/Wp2=5 $\mu$m/15 $\mu$m and Wn2/Wp2=20 $\mu$m/60 $\mu$m, while the linearity of the oscillation frequency to the control voltage is superior in the case of Wn2/Wp2=10 $\mu$m/30 $\mu$m. Change in the gate width corresponds to change in the current driving capability of the transistor. In order to obtain superior linearity, it is considered that the current driving capability of each of the control transistors N2 and P2 of the inverter circuit 10' needs to be at least more than thrice (which may slightly vary depending on the resistance values of the control transistors N3 and P3) the current driving capability of each of the control transistors N3 and P3 of the current-control elements 11 and 12. Further, in the case that the control voltage is high, the upper limit of the oscillation frequency is restricted by the ON resistance of each of the control transistors N3 and P3 of the current control elements. Therefore, it is preferable to increase the current driving capability of each of the control transistors N2 and P2 of the inverter circuit 10', and decrease the ON resistance thereof. In this arrangement, as a result of setting the resistance values of the resistances Ru and Rd and the sizes of the control transistors N3 and P3 of the current-control elements 11 and 12 to the optimum ones, it is easy to set the central value of the range of the oscillation voltage to VCC/2.

In the second embodiment, the current-control element 11 is connected between the points VCC and OUT, and also, the current-control element 12 is connected between the points OUT and GND. In a voltage-controlled oscillator in a third embodiment of the present invention, the current-control element 11 is connected between the points VCC and OUT, or the current-control element 12 is connected between the points OUT and GND.

Figure 13A:
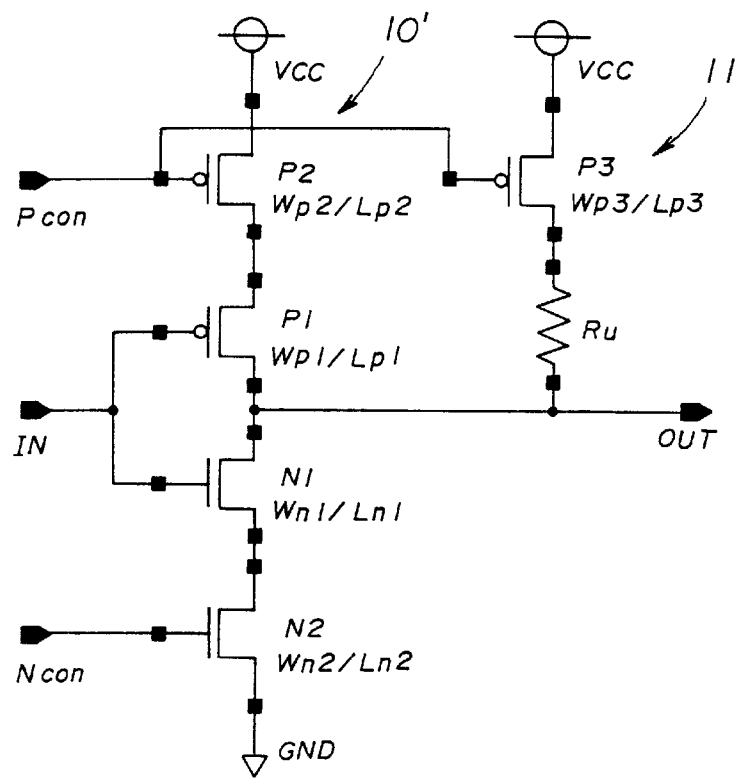
FIG. 13A is a circuit diagram showing one inverter circuit portion in one example of a third embodiment of the present invention.
Figure 13B:
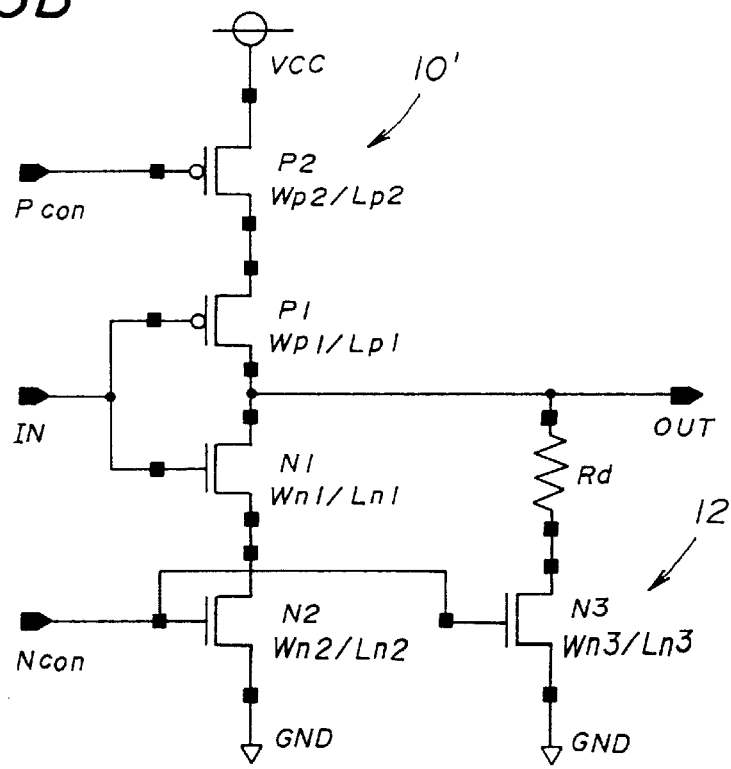
FIG. 13B is a circuit diagram showing one inverter circuit portion in another example of the third embodiment of the present invention.

FIG. 13A shows an arrangement in which the current-control element 11 including the p-channel MOSFET P3 and the resistance element Ru are provided between the point VCC and the point OUT. FIG. 13B shows an arrangement in which the current-control element 12 including the n-channel MOSFET N3 and the resistance element Rd are provided between the point OUT and the point GND. The voltage-controlled oscillator in the third embodiment of the present invention includes an odd number of the inverter circuits 10' which are connected with each other so as to form a ring (ring oscillator). Each inverter circuit 10' has the arrangement shown in FIG. 13A or 13B, and has the current-control element 11 shown in FIG. 13A or the current-control element 12 shown in FIG. 13B, provided thereto.

In the arrangement shown in FIG. 13A or 13B, the upper limit or the lower limit of the range of the oscillation voltage is VCC or GND. Thereby, the maximum oscillation frequency is lower than that of the second embodiment, and also, an output-level converting circuit is needed so as to shift the center of the range of the oscillation voltage to VCC/2. However, it is possible to reduce power consumption in comparison to the arrangement of the second embodiment.

Generally, in many cases, enhancement-type MOSFETs are used as MOSFETs of the inverter circuit. In the enhancement-type MOSFET, the channel connecting the source and the drain is formed by the effects of an applied gate voltage. It is considered that the enhancement-type MOSFETs are used as the MOSFETs N1 and P1 of the inverter circuit 10 and 10' in the first, second and third embodiments. A voltage-controlled oscillator in a fourth embodiment of the present invention is obtained as a result of depletion-type MOSFETs being used as the MOSFETs N1 and P1 of each inverter circuit 10, 10' of any of the first, second and third embodiments. In the depletion-type MOSFET, the channel connecting the source and the drain is formed without the effects of an applied gate voltage. When the depletion-type MOSFETs are used as the MOSFETs N1 and P1 of the inverter circuit 10, 10', the response speed of the inverter circuit 10, 10' is high in comparison with the case where the enhancement-type MOSFETs are used as the MOSFETs N1 and P1 of the inverter circuit 10, 10'. As a result, it is possible to increase the maximum value of the oscillation frequency of the voltage-controlled oscillator.

Each of the voltage-controlled oscillators in the first, second, third and fourth embodiments uses the inverter circuits, each of which has the range of the oscillation voltage of 0 through VCC, and has the current-control element(s) added thereto. However, it is also possible to instead use the inverter circuits of the differential-amplifier-type inverters, disclosed in 'A 320 MHz CMOS Triple 8 bit DAC with On-Chip PLL and Hardware Cursor', David Reynolds, *IEEE JOURNAL OF SOLID-STATE CIRCUIT*, Vol. 29, No. 12, December, 1994, and add the current-control element(s) to each of the inverter circuits.

Figure 14A:
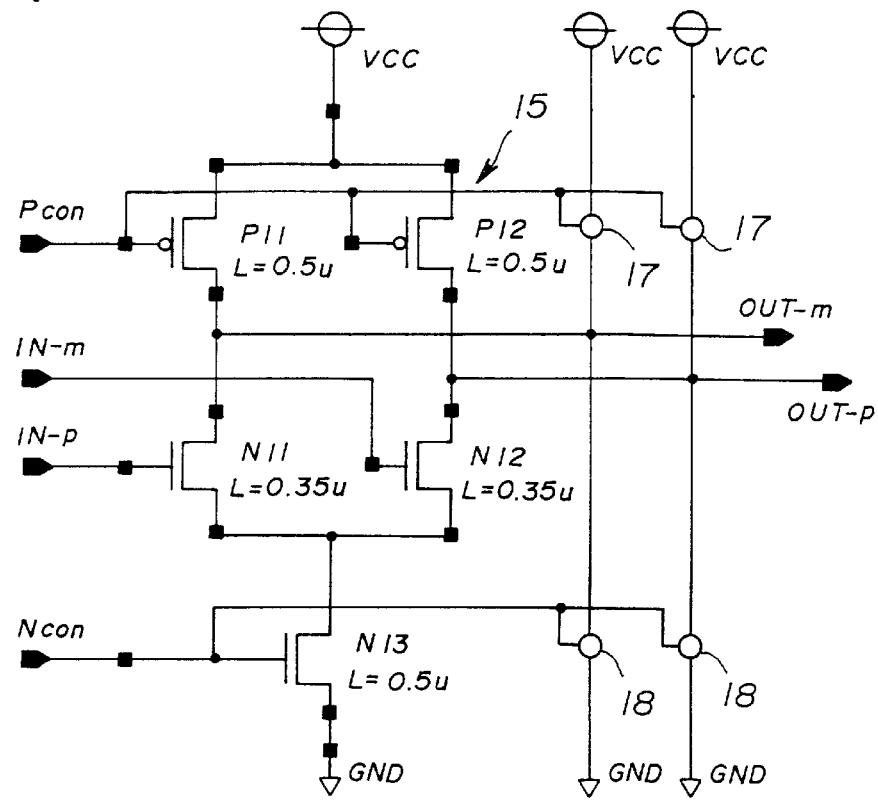
FIG. 14A is a circuit diagram showing a differential-amplifier-type inverter circuit portion in a fifth embodiment of the present invention.
Figure 14B:
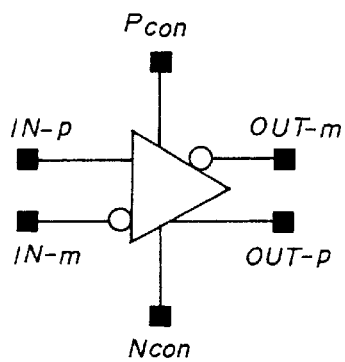
FIG. 14B is a symbolic diagram of the circuit diagram shown in FIG. 14A.
Figure 14C:
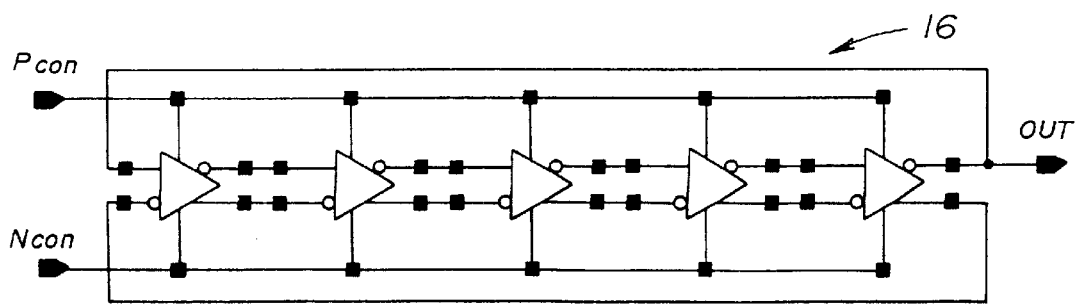
FIG. 14C is a circuit diagram of a voltage-controlled oscillator using the differential-amplifier-type inverter circuit portion shown in FIG. 14A.

FIG. 14A shows a circuit diagram of the inverter circuit 15 of the differential-amplifier-type inverter which is used in a voltage-controlled oscillator in a fifth embodiment of the present invention. FIG. 14B shows a symbolic diagram of this inverter circuit. FIG. 14C shows the voltage-controlled oscillator 16 in the fifth embodiment indicated by using the symbolic diagram shown in FIG. 14B. The inverter circuit 15 of the differential-amplifier-type inverter includes three control-signal-inputting transistors, consisting of two p-channel MOSFETs P11, P12 and an n-channel MOSFET N13, and two oscillation-signal-inputting n-channel MOSFETs N11 and N12. This inverter circuit 15 has two inputs IN-m, IN-p and two outputs OUT-m, OUT-p. The first control signal Pcon is input to gates of the p-channel MOSFETs P11 and P12, and the second control signal Ncon is input to the gate of the n-channel MOSFET N13. Further, current-control elements 17 and 18 are connected to the output OUT-m and other current-control elements 17 and 18 are connected to the output OUT-p. Each of the current-control elements 17 is the same as the current-control element 11 shown in FIGS. 7A and 10A. Each of the current-control elements 18 is the same as the current-control element 12 shown in FIGS. 7A and 10A. In the voltage-controlled oscillator in the fifth embodiment, the inverter circuits 15 are connected with each other so as to form a ring (ring oscillator (as shown in FIG. 14C), and the current-control elements 17, 17, 18 and 18 are provided for each of the inverter circuits 15, as shown in FIG. 14A.

In the arrangement shown in FIG. 14A, the range of the oscillation voltage narrows as a result of a constant current flowing through the n-channel MOSFET N13. As a result, the oscillation frequency increases. However, as described above, when the voltage-controlled oscillator uses the inverter circuits of the differential-amplifier-type inverters, the upper limit of the range of the oscillation voltage is always VCC. As a result, an output-level converting circuit for shifting the central value of the range of the oscillation voltage to VCC/2 is needed. However, the current-control elements 17 and 18 can change the central value of the range of the oscillation voltage freely to a certain extent as a result of set values thereof being changed. In fact, by setting such that, for example, Ru>Rd in the current-control elements 17 and 18, so that the charging current flowing from VCC is smaller than the discharging current flowing to GND, it is possible to set the central value of the range of the oscillation voltage to VCC/2 without using the output-level converting circuit. In principle, a high oscillation frequency can be obtained from the voltage-controlled oscillator using the inverter circuits of the differential-amplifier inverters. As a result of the current-control elements 17 and 18 being added, a further high oscillation frequency can be obtained from the voltage-controlled oscillator.

Figure 15A:
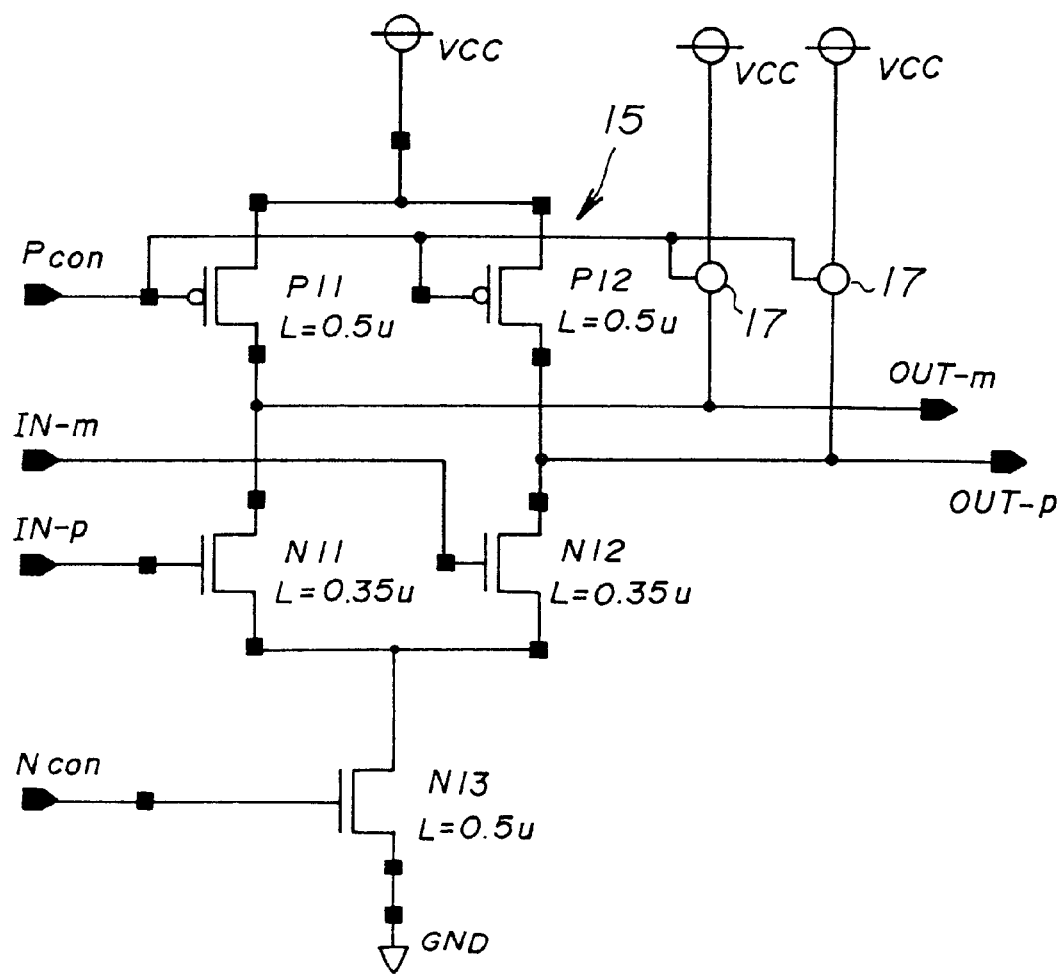
FIG. 15A is a circuit diagram showing a differential-amplifier-type inverter circuit portion in a first variant embodiment of the fifth embodiment of the present invention.

FIG. 15A shows an arrangement in a first variant embodiment of the fifth embodiment. The arrangement shown in FIG. 15A includes the inverter circuit 15 of the differential-amplifier-type inverter which is the same as that shown in FIG. 14A, and the current-control elements 17 and 17 which are the same as those shown in FIG. 14A and are connected between VCC and the outputs OUT-m, OUT-p of the inverter circuit 15, respectively. In the voltage-controlled oscillator in the first variant embodiment of the fifth embodiment, an odd number of the inverter circuits 15 are connected with each other so as to form a ring (ring oscillator (as shown in FIG. 14C), and the current-control elements 17 and 17 are provided for each of the inverter circuits 15, as shown in FIG. 15A.

Figure 15B:
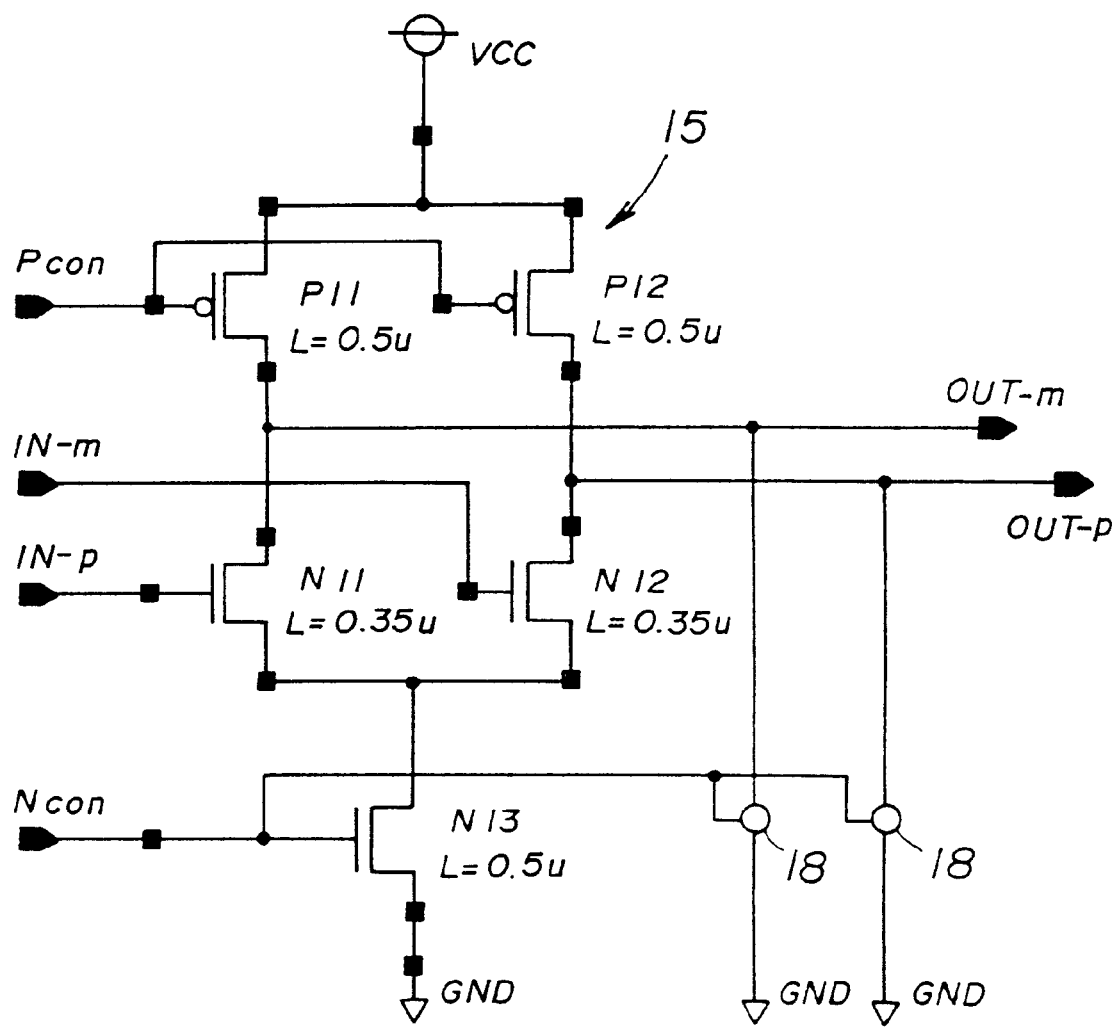
FIG. 15B is a circuit diagram showing a differential-amplifier-type inverter circuit portion in a second variant embodiment of the fifth embodiment of the present invention.

FIG. 15B shows an arrangement in a second variant embodiment of the fifth embodiment. The arrangement shown in FIG. 15B includes the inverter circuit 15 of the differential-amplifier-type inverter which is the same as that shown in FIG. 14A, and the current-control elements 18 and 18 which are the same as those shown in FIG. 14A and are connected between the outputs OUT-m, OUT-p of the inverter circuit 15 and GND, respectively. In the voltage-controlled oscillator in the second variant embodiment of the fifth embodiment, an odd number of the inverter circuits 15 are connected with each other so as to form a ring (ring oscillator (as shown in FIG. 14C), and the current-control elements 18 and 18 are provided for each of the inverter circuits 15, as shown in FIG. 15B.

In each of the voltage-controlled oscillators (VCOs) in the first, second, third, fourth and fifth embodiments, and first and second variant embodiments of the fifth embodiment, the range of the oscillation voltage is narrower than the range between 0 and VCC. Therefore, in comparison with a voltage-controlled oscillator in the prior art having the range of the oscillation voltage between 0 and VCC, generation of noise resulting from the oscillation is reduced.

Figure 16:
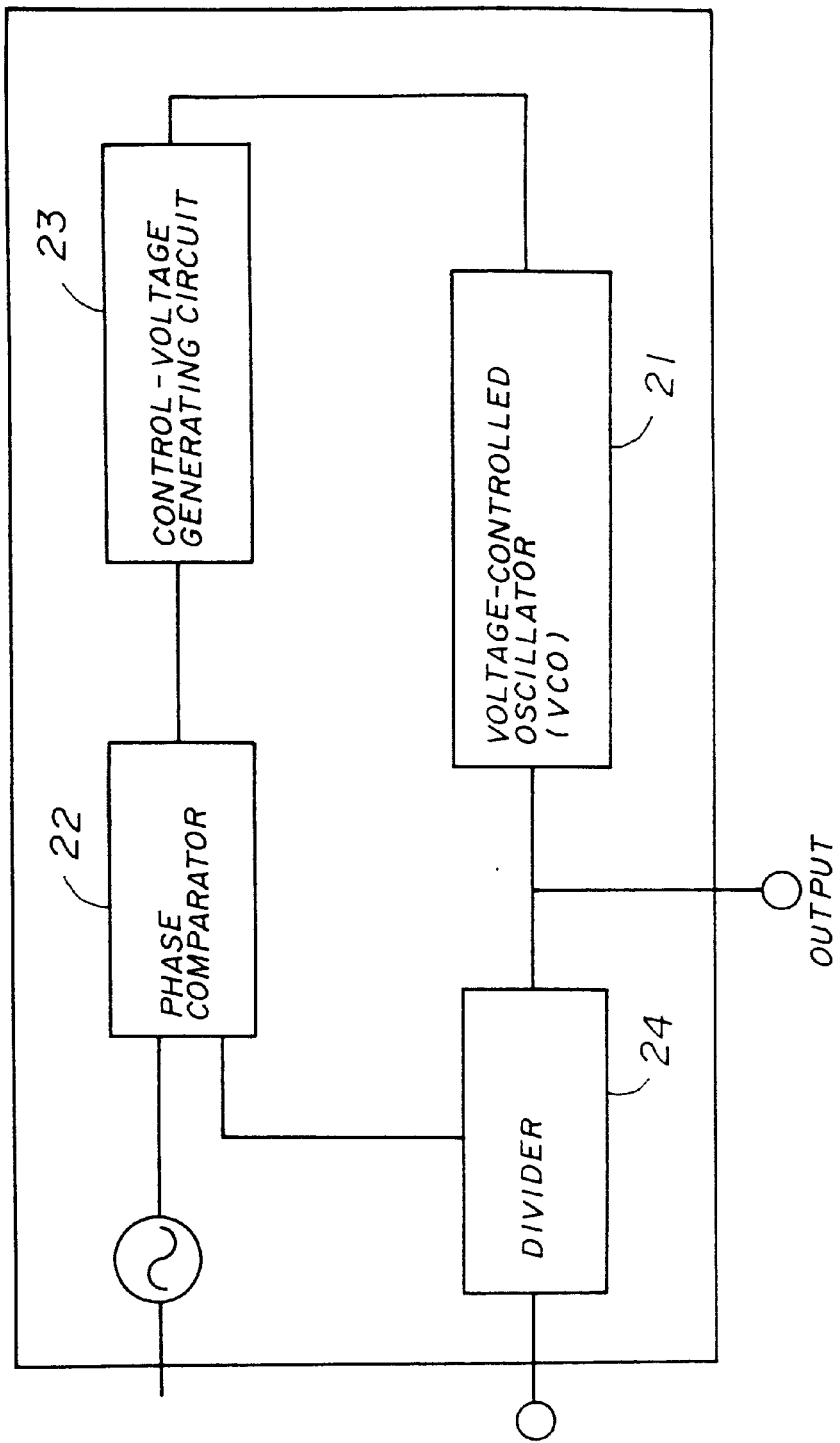
FIG. 16 shows a block diagram of a phase-locked loop circuit in a sixth embodiment of the present invention.

A phase-locked loop (PLL) circuit in a sixth embodiment of the present invention includes the voltage-controlled oscillator in any of the first, second, third, fourth and fifth embodiments, and first and second variant embodiments of the fifth embodiment. The phase-locked loop circuit in the sixth embodiment includes, as shown in FIG. 16, the voltage-controlled oscillator 21, a divider 24 which lowers the frequency of the output of the voltage-controlled oscillator 21, a phase comparator 22 which compares the output of the divider 24 with a reference signal, a control-voltage generating circuit 23 which generates a control voltage based on the output of the phase comparator 22 and provides the control voltage to the voltage-controlled oscillator 21, and so forth. All of the above-mentioned circuits of the phase-locked loop circuit are formed on one semiconductor substrate.

As a result of all the circuits being formed on the one semiconductor substrate and thus being formed in one chip, a high value is added to the chip, the assembling work for the phase-locked loop circuit becomes easier (analog technique is not needed), and power consumption of the phase-locked loop circuit is reduced. Noise, which has been a problem when forming a phase-locked loop circuit in one chip in the related art, is not a problem in forming the phase-locked loop circuit in one chip as a result of the voltage-controlled oscillator in any of the first, second, third, fourth and fifth embodiments, and first and second variant embodiments of the fifth embodiment being used therein. This is because, as mentioned above, in the voltage-controlled oscillator in any of the first, second, third, fourth and fifth embodiments, and first and second variant embodiments of the fifth embodiment, generation of noise can be reduced.

Figure 17:
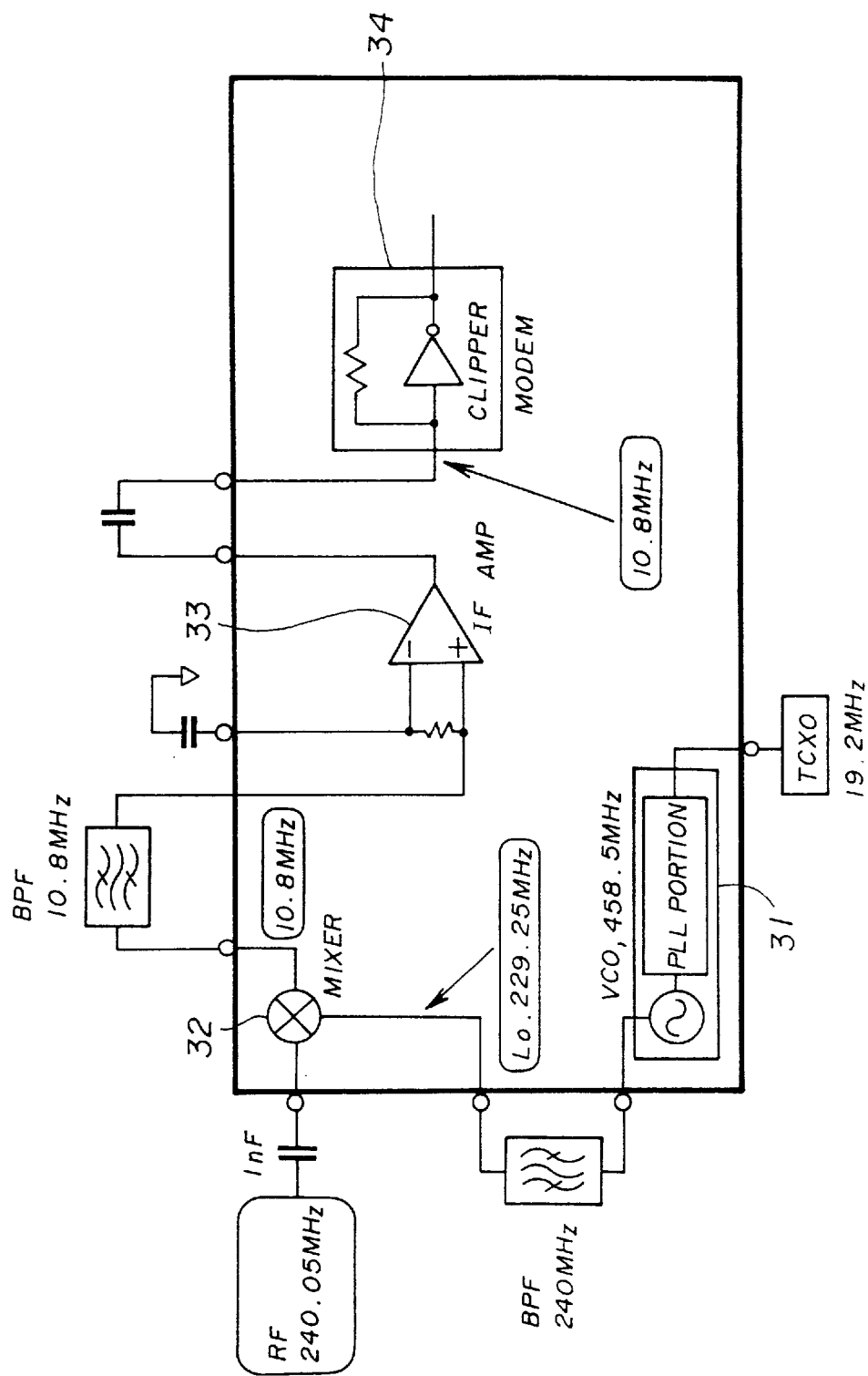
FIG. 17 shows a block diagram of an intermediate-frequency processing circuit in a seventh embodiment of the present invention.

An intermediate-frequency processing circuit in a seventh embodiment of the present invention includes, as shown in FIG. 17, a PLL 31, a mixer 32, an IF (Intermediate-Frequency) amplifier 33, a modem 34 and so forth, all of which are formed on one semiconductor substrate. From the PLL 31, a reference local signal of 229.25 MHz is output. The mixer 32 inputs an RF signal of 240.05 MHz and the reference local signal of 229.25 MHz thereto, and performs mixing. Thus, the mixer 32 provides an output signal of 10.8 MHz which is the frequency difference between the two input signals. This output signal is amplified by the IF amplifier 33 to have a voltage amplitude which can be processed by a digital circuit of the modem 34. The thus-amplified signal is processed by the modem 34.

Further, the present invention is not limited to the above-described embodiments, and variations and modifications may be made without departing from the scope of the present invention.

The contents of the basic Japanese Patent Application No. 9-230760, filed on Aug. 27, 1997, are hereby incorporated by reference.

What is claimed is:

1. A voltage-controlled oscillator in which an odd number of inverter circuits are connected with each other so as to form a ring, comprising:

a first current-control element connected to an oscillation signal line which is used for connecting adjacent inverter circuits and a power-source-potential point, a current flowing through said first current-control element varying by a first control signal; and a second current-control element connected to the oscillation signal line and a ground point, a current flowing through said second current-control element varying by a second control signal, wherein each first current-control element includes a resistance element and a p-channel metal-oxide-semiconductor transistor;

each second current-control element includes a resistance element and an n-channel metal-oxide-semiconductor transistor;

the first control signal is input to the gate of said p-channel metal-oxide-semiconductor transistor; and the second control signal is input to the gate of said n-channel metal-oxide-semiconductor transistor.

2. A The voltage-controlled oscillator in which an odd number of inverter circuits are connected with each other so as to form a ring, comprising:

a first current-control element connected to an oscillation signal line which is used for connecting adjacent inverter circuits and a power-source-potential point, a current flowing through said first current-control element varying by a first control signal; and a second current-control element connected to the oscillation signal line and a ground point, a current flowing through said second current-control element varying by a second control signal, wherein each inverter circuit includes a first p-channel metal-oxide-semiconductor transistor and a first n-channel metal-oxide-semiconductor transistor;

a connecting point of said first p-channel metal-oxide-semiconductor transistor and said first n-channel metal-oxide-semiconductor transistor is connected with a subsequent stage;

a connecting point of the gates of said first p-channel metal-oxide-semiconductor transistor and said first n-channel metal-oxide-semiconductor transistor is connected with a preceding stage;

each inverter circuit further includes a second p-channel metal-oxide-semiconductor transistor connected between the power-source-potential point and said first p-channel metal-oxide-semiconductor transistor, and a second n-channel metal-oxide-semiconductor transistor connected between said first n-channel metal-oxide-semiconductor transistor and the ground point;

the first control signal is supplied to the gate of said second p-channel metal-oxide-semiconductor transistor; and the second control signal is supplied to the gate of said second n-channel metal-oxide-semiconductor transistor.

3. The voltage-controlled oscillator, according to claim 2, wherein the relationship between the current driving capabilities of the metal-oxide-semiconductor transistors of each inverter circuit and the current driving capabilities of the metal-oxide-semiconductor transistors of respective ones of the current-control elements is set so that the change of the oscillation frequency is linear to the change of the voltage of each control signal.

4. A voltage-controlled oscillator in which an odd number of inverter circuits are connected with each other so as to form a ring, comprising:

a first current-control element connected to an oscillation signal line which is used for connecting adjacent inverter circuits and a power-source-potential point, a current flowing through said first current-control element varying by a first control signal; and a second current-control element connected to the oscillation signal line and a ground point, a current flowing through said second current-control element varying by a second control signal, wherein each inverter circuit comprises a differential-amplifier-type inverter including three control-signal-inputting transistors and two oscillation-signal-inputting transistors;

the first control signal is input to the gates of two of said three control-signal-inputting transistors; and the second control signal is input to the gate of the other one of said three control-signal-inputting transistors.

5. A voltage-controlled oscillator in which an odd number of inverter circuits are connected with each other so as to form a ring, comprising:

a first current-control element connected to an oscillation signal line which is used for connecting adjacent inverter circuits and a power-source-potential point, a current flowing through said first current-control element varying by a first control signal; and a second current-control element connected to the oscillation signal line and a ground point, a current flowing through said second current-control element varying by a second signal, wherein each first current-control element includes a resistance element and a p-channel metal-oxide-semiconductor transistor;

each second current-control element includes a resistance element and an n-channel metal-oxide-semiconductor transistor;

the first control signal is input to the gate of said p-channel metal-oxide-semiconductor transistor; and the second control signal is input to the gate of said n-channel metal-oxide-semiconductor transistor.

6. A voltage-controlled oscillator, in which an odd number of inverter circuits are connected with each other so as to form a rin, comprising:

a first current-control element connected to an oscillation signal line which is used for connecting adjacent inverter circuits and a power-source-potential point, a current flowing through said first current-control element varying by a first control signal; and a second current-control element connected to the oscillation signal line and a ground point, a current flowing through said second current-control element varying by a second control signal, wherein each inverter circuit includes a first p-channel metal-oxide-semiconductor transistor and a first n-channel metal-oxide-semiconductor transistor;

a connecting point of said first p-channel metal-oxide-semiconductor transistor and said first n-channel metal-oxide-semiconductor transistor is connected with a subsequent stage;

a connecting point of the gates of said first p-channel metal-oxide-semiconductor transistor and said first n-channel metal-oxide-semiconductor transistor is connected with a preceding stage;

each inverter circuit further includes a second p-channel metal-oxide-semiconductor transistor connected between the power-source-potential point and said first p-channel metal-oxide-semiconductor transistor, and a second n-channel metal-oxide-semiconductor transistor connected between said first n-channel metal-oxide-semiconductor transistor and the ground point;

the first control signal is supplied to the gate of said second p-channel metal-oxide-semiconductor transistor; and the second control signal is supplied to the gate of said second n-channel metal-oxide-semiconductor transistor.

7. A voltage-controlled oscillator, in which an odd number of inverter circuits are connected with each other so as to form a ring, comprising:

a first current-control element connected to an oscillation signal line which is used for connecting adjacent inverter circuits and a power-source-potential point, a current flowing through said first current-control element varying bv a first control signal; and a second current-control element connected to the oscillation signal line and a ground point, a current flowing through said second current-control element varying by a second control signal, wherein each inverter circuit comprises a differential-amplifier-type inverter including three control-signal-inputting transistors and two oscillation-signal-inputting transistors;

the first control signal is input to the gates of two of said three control-signal-inputting transistors; and the second control signal is input to the gate of the other one of said three control-signal-inputting transistors.

8. The voltage-controlled oscillator, according to claim 1, wherein each resistance element comprises one of a well resistance and a non-doped polysilicon resistance.

9. The voltage-controlled oscillator, according to claim 5, wherein each resistance element comprises one of a well resistance and a non-doped polysilicon resistance.

10. A voltage-controlled oscillator, in which an odd number of inverter circuits are connected with each other so as to form a ring, comprising:
   a first current-control element connected to an oscillation signal line which is used for connecting a adjacent inverter circuits and a power-source-potential point, a current flowing through said first current-control element varying bv a first control signal; and
   a second current-control element connected to the oscillation signal line and a ground point, a current flowing through said second current-control element varying bv a second control signal, wherein transistors of each inverter circuit comprise depletion-type transistors.

11. A voltage-controlled oscillator, in which an odd number of inverter circuits are connected with each other so as to form a ring, comprising:
   a first current-control element connected to an oscillation signal line which is used for connecting adjacent inverter circuits and a power-source-potential point, a current flowing through said first current-control element varying by a first control signal; and
   a second current-control element connected to the oscillation signal line and a ground point, a current flowing through said second current-control element varying by a second control signal, wherein transistors of each inverter circuit comprise depletion-type transistors.

12. An intermediate frequency processing circuit, comprising:
   a mixer for converting a frequency;
   a phase-locked loop circuit which provides an oscillation signal, the frequency of which is then converted by said mixer;
   an amplifier which amplifies the signal output by said mixer; and
   a modulating and demodulating circuit connected with said amplifier,
   wherein said phase-locked loop circuit comprises:
      a voltage-controlled oscillator in which an odd number of inverter circuits are connected with each other so as to form a ring, said voltage-controlled oscillator comprising:
         a first current-control element provided between an oscillation signal line which is used for connecting adjacent inverter circuits and a power-source-potential point, a current flowing through said first current-control element varying by a first control signal, and
         a second current-control element provided between the oscillation signal line and a ground point, a current flowing through said second current-control element varying by a second control signal;
      a control-voltage generating circuit which supplies the control signals to said voltage-controlled oscillator;
      a divider which lowers the frequency of the oscillation signal output from said voltage-controlled oscillator; and
      a phase comparator which compares the signal from said divider with a reference signal, and provides the comparison result to said control-voltage generating circuit, and
   wherein said mixer, said phase-locked loop circuit, said amplifier and said modulating and demodulating circuit are provided on one semiconductor substrate.

13. An intermediate-frequency processing circuit, comprising:
   a mixer for converting a frequency;
   a phase-locked loop circuit which provides an oscillation signal, the frequency of which is converted by said mixer;
   an amplifier which amplifies the signal output by said mixer; and
   a modulating and demodulating circuit connected with said amplifier,
   wherein said phase-locked loop circuit comprises:
      a voltage-controlled oscillator in which an odd number of inverter circuits are connected with each other so as to form a ring, said voltage-controlled oscillator comprising one of:
         a first current-control element provided between an oscillation signal line which is used for connecting adjacent inverter circuits and a power-source-potential point, a current flowing through said first current-control element varying by a first control signal, and
         a second current-control element provided between the oscillation signal line and a ground point, a current flowing through said second current-control element varying by a second control signal;
      a control-voltage generating circuit which supplies the control signals to said voltage-controlled oscillator;
      a divider which lowers the frequency of the oscillation signal output from said voltage-controlled oscillator; and
      a phase comparator which compares the signal from said divider with a reference signal, and provides the comparison result to said control-voltage generating circuit, and
   wherein said mixer, said phase-locked loop circuit, said amplifier and said modulating and demodulating circuit are provided on one semiconductor substrate.

14. The voltage-controlled oscillator, according to claim 11, wherein:
   each inverter circuit includes a p-channel metal-oxide-semiconductor transistor and an n-channel metal-oxide-semiconductor transistor connected between the power-source-potential point and the ground point;
   a connecting point of said p-channel metal-oxide-semiconductor transistor and said n-channel metal-oxide-semiconductor transistor is connected with a subsequent stage; and
   a connecting point of the gates of said p-channel metal-oxide-semiconductor transistor and said n-channel metal-oxide-semiconductor transistor is connected with a preceding stage.

15. The voltage-controlled oscillator, according to claim 1, wherein:
   each inverter circuit comprises a differential-amplifier-type inverter including three control-signal-inputting transistors and two oscillation-signal-inputting transistors;
   the first control signal is input to the gate of two of said three control-signal-inputting transistors; and
   the second control signal is input to the gate of the other one of said three control-signal-inputting transistors.

16. The voltage-controlled oscillator, according to claim 1, wherein each resistance element comprises one of a well resistance and a non-doped polysilicon resistance.

17. The voltage-controlled oscillator, according to claim 5, wherein:

each inverter circuit comprises a differential-amplifier-type inverter including three control-signal-inputting transistors and two oscillation-signal-inputting transistors;

the first control signal is input to the gate of two of said three control-signal-inputting transistors; and the second control signal is input to the gate of the other one of said three control-signal-inputting transistors.

18. A semiconductor integrated circuit comprising a voltage-controlled oscillator in which an odd number of inverter circuits are connected with each other so as to form a ring, said voltage-controlled oscillator comprising:

a first current-control element connected to an oscillation signal line which is used for connecting adjacent inverter circuits and a power-source-potential point, a current flowing through said first current-control element varying by a first control signal, and a second current-control element connected to the oscillation signal line and a ground point, a current flowing through said second current-control element varying by a second control signal; wherein each first current-control element includes a resistance element and a p-channel metal-oxide-semiconductor transistor;

each second current-control element includes a resistance element and an n-channel metal-oxide-semiconductor transistor;

the first control signal is input to the gate of said p-channel metal-oxide-semiconductor transistor; and the second control signal is input to the gate of said n-channel metal-oxide-semiconductor transistor;

wherein said voltage-controlled oscillator and other components are provided on one semiconductor substrate.

19. A semiconductor integrated circuit comprising a voltage-controlled oscillator in which an odd number of inverter circuits are connected with each other so as to form a ring, said voltage-controlled oscillator comprising one of:

a first current-control element connected to an oscillation signal line which is used for connecting adjacent inverter circuits and a power-source-potential point, a current flowing through said first current-control element varying by a first control signal, and a second current-control element connected to the oscillation signal line and a ground point, a current flowing through said second current-control element varying by a second control signal; wherein each first current-control element includes a resistance element and a p-channel metal-oxide-semiconductor transistor;

each second current-control element includes a resistance element and an n-channel metal-oxide-semiconductor transistor;

the first control signal is input to the gate of said p-channel metal-oxide-semiconductor transistor; and the second control signal is input to the gate of said n-channel metal-oxide-semiconductor transistor;

wherein said voltage-controlled oscillator and other components are provided on one semiconductor substrate.

20. A phase-locked loop circuit comprising:

a voltage-controlled oscillator in which an odd number of inverter circuits are connected with each other so as to form a ring, said voltage-controlled oscillator comprising:

a first current-control element connected to an oscillation signal line which is used for connecting adjacent inverter circuits and a power-source-potential point, a current flowing through said first current-control element varying by a first control signal, and a second current-control element connected to the oscillation signal line and a ground point, a current flowing through said second current-control element varying by a second control signal;

a control-voltage generating circuit which supplies the control signal to said voltage-controlled oscillator;

a divider which lowers the frequency of the oscillation signal output from said voltage-controlled oscillator; and a phase comparator which compares the signal from said divider with a reference signal, and provides the comparison result to said control-voltage generating circuit wherein each first current-control element includes a resistance element and a p-channel metal-oxide-semiconductor transistor;

each second current-control element includes a resistance element and an n-channel metal-oxide-semiconductor transistor;

the first control signal is input to the gate of said p-channel metal-oxide-semiconductor transistor; and the second control signal is input to the gate of said n-channel metal-oxide-semiconductor transistor;

wherein said voltage-controlled oscillator, said control-voltage generating circuit, said divider and said phase comparator are provided on one semiconductor substrate.

21. A phase-locked loop circuit comprising:

a voltage-controlled oscillator in which an odd number of inverter circuits are connected with each other so as to form a ring, said voltage-controlled oscillator comprising one of:

a first current-control element connected to an oscillation signal line which is used for connecting adjacent inverter circuits and a power-source-potential point, a current flowing through said first current-control element varying by a first control signal, and a second current-control element connected to the oscillation signal line and a ground point, a current flowing through said second current-control element varying by a second control signal;

a control-voltage generating circuit which supplies the control signals to said voltage-controlled oscillator;

a divider which lowers the frequency of the oscillation signal output from said voltage-controlled oscillator; and a phase comparator which compares the signal from said divider with a reference signal, and provides the comparison result to said control-voltage generating circuit wherein each first current-control element includes a resistance element and a p-channel metal-oxide-semiconductor transistor;

each second current-control element includes a resistance element and an n-channel metal-oxide-semiconductor transistor;

the first control signal is input to the gate of said p-channel metal-oxide-semiconductor transistor; and the second control signal is input to the gate of said n-channel metal-oxide-semiconductor transistor;

wherein said voltage-controlled oscillator, said control-voltage generating circuit, said divider and said phase comparator are provided on one semiconductor substrate.

* * * * *